(12) United States Patent
Sharapov et al.

(10) Patent No.: US 10,962,357 B2
(45) Date of Patent: Mar. 30, 2021

(54) THREE-DIMENSIONAL SCANNER WITH DATA COLLECTION FEEDBACK

(71) Applicant: ARTEC EUROPE S.À R.L., Luxembourg (LU)

(72) Inventors: Alexander Alexandrovich Sharapov, Trintange (LU); Sergey Vladimirovich Sukhovey, Bridel (LU); Gleb Alexandrovich Gusev, Mensdorf (LU); Artem Leonidovich Yukhin, Gostingen (LU)

(73) Assignee: ARTEC EUROPE S.À R.L., Luxembourg (LU)

( * ) Notice: Subject to any disclaimer, the term of this patent is extended or adjusted under 35 U.S.C. 154(b) by 0 days.

(21) Appl. No.: 16/909,427

(22) Filed: Jun. 23, 2020

(65) Prior Publication Data

US 2020/0318955 A1 Oct. 8, 2020

Related U.S. Application Data

(63) Continuation of application No. PCT/IB2019/000989, filed on Aug. 29, 2019.
(Continued)

(51) Int. Cl.
*G01B 11/25* (2006.01)
*G01B 21/18* (2006.01)
(Continued)

(52) U.S. Cl.
CPC ...... *G01B 11/2518* (2013.01); *G01B 11/2513* (2013.01); *G01B 21/18* (2013.01); *G01C 11/025* (2013.01); *H01S 5/18308* (2013.01)

(58) Field of Classification Search
CPC ........ G02B 2027/0138; G02B 27/0172; G02B 2027/0178; G02B 27/0093;
(Continued)

(56) References Cited

U.S. PATENT DOCUMENTS 6,636,255 B1 * 10/2003 Kobayashi ........... G01B 11/254
348/98
9,602,811 B2 * 3/2017 Hillebrand ......... G01B 11/2513
(Continued)

FOREIGN PATENT DOCUMENTS

WO WO2017/062044 A1 4/2017

OTHER PUBLICATIONS

Artec Europe S.A R.L., International Search Report and Written Opinion, PCT/IB2019/000989, dated Feb. 4, 2020, 17 pgs.

*Primary Examiner* — Michael P Stafira
(74) *Attorney, Agent, or Firm* — Morgan, Lewis & Bockius LLP

(57) ABSTRACT

A three-dimensional (3D) scanner includes a housing, one or more light sources, one or more optical sensors, a plurality of processors in communication with the one or more light sources and the one or more optical sensors, and memory storing instructions for generating data corresponding to a 3D shape of a surface of an object by repeatedly performing the operations of: projecting, using the one or more light sources, structured light toward the surface of the object; and while projecting the structured light toward the surface of the object, acquiring, using the one or more optical sensors, an image of the surface of the object. The 3D scanner further includes a cooling manifold internal to the housing comprising a single piece of metal thermally coupled with the one or more light sources, the one or more optical sensors and the plurality of processors.

20 Claims, 14 Drawing Sheets

Related U.S. Application Data

(60) Provisional application No. 62/733,588, filed on Sep. 19, 2018.

(51) Int. Cl.
  G01C 11/02 (2006.01)
  H01S 5/183 (2006.01)

(58) Field of Classification Search
  CPC ...... G02B 2027/0129; G02B 2027/014; G02B 2027/0141; G02B 2027/0174; G02B 2027/0181; G02B 2027/0187; G02B 27/01; G02B 27/0176; G02B 27/0179; G01B 11/2433; G01B 9/02009; G01B 9/02078; G01B 9/02087; G01B 9/02091; G01B 11/2513; G01B 11/24; G01B 11/002; G01B 11/25; G01B 11/2518; G01B 11/2531; G01B 5/004; G01B 11/2545; G01B 21/045; G01B 11/245; G01B 11/0608; G01B 21/18; G01B 11/005; G01B 11/2504; G01B 11/2522; G01B 11/2536; G01B 11/26; G01B 11/303; G01B 2210/52; G01B 11/03; G01B 11/2509; G01B 11/2527; G01B 11/272; G01B 17/06; G01B 21/047; G01B 21/20; G01B 21/22; G01B 2210/58; G01B 5/0002; G01B 5/0004; G01B 9/02083; G01J 3/501; G01J 3/508; G01N 21/64; G01N 21/8851; G01N 2201/06113; G01N 2201/10; G01N 22/02
  See application file for complete search history.

(56) References Cited

U.S. PATENT DOCUMENTS

| | | |
|---|---|---|
| 2007/0172112 A1 | 7/2007 | Paley et al. |
| 2010/0309483 A1 | 12/2010 | Crowther |
| 2016/0073085 A1 | 3/2016 | Hillebrand et al. |
| 2016/0084633 A1 | 3/2016 | Ferrari et al. |
| 2016/0350833 A1* | 12/2016 | Andon ............... G06Q 30/0631 |
| 2018/0023949 A1 | 1/2018 | Semmelmann et al. |
| 2018/0210971 A1* | 7/2018 | Germann ............... G01B 11/24 |
| 2018/0227570 A1* | 8/2018 | Page ................. H04N 5/23245 |
| 2019/0295244 A1* | 9/2019 | Adachi ............... G06K 9/6271 |
| 2019/0388194 A1* | 12/2019 | Atiya ................ G01B 11/2513 |

* cited by examiner

LEGEND

NO DATA

LOW QUANTITY/QUALITY OF DATA

MEDIUM QUANTITY/QUALITY OF DATA

HIGH QUANTITY/QUALITY OF DATA 400-c

LEGEND

NO DATA

LOW QUANTITY/QUALITY OF DATA

MEDIUM QUANTITY/QUALITY OF DATA

HIGH QUANTITY/QUALITY OF DATA

LEGEND

NO DATA

LOW QUANTITY/QUALITY OF DATA

MEDIUM QUANTITY/QUALITY OF DATA

HIGH QUANTITY/QUALITY OF DATA

LEGEND

☐ NO DATA

▨ LOW QUANTITY/QUALITY OF DATA

▧ MEDIUM QUANTITY/QUALITY OF DATA

▦ HIGH QUANTITY/QUALITY OF DATA

600

```
Scan, using one or more optical sensors, an object having a surface.          ─602

The scanning generates data corresponding to a three-dimensional (3D)
shape of at least a portion of the surface of the object.
```

```
The one or more sensors include a camera.                                      ─604

Scanning the object includes repeatedly performing the operations of:
projecting a spatial pattern of light onto the surface of the object; and
while the spatial pattern of light is projected onto the surface of the
object, acquiring, using the camera, an image of surface of the object.
```

```
Generate, using the data, a 3D reconstruction of the at least portion of the   ─606
shape of the surface of the object.
```

```
Provide, to the display, a preview of the 3D reconstruction of the at least    ─608
portion of the shape of the surface of the object.
```

```
Provide, to the display, for rendering with the preview of the 3D              ─610
reconstruction of the at least portion of the shape of the surface of the
object, an indication of at least one of a quantity or a quality of the data
corresponding to the 3D shape of the at least portion of the surface of the
object.
```

```
Provide, to the display, a plurality of distinct indicia of at least one of    ─612
quantity or quality of data corresponding to distinct portions of the
surface of the object.
```

```
The indication of the at least one of the quantity or the quality of the       ─614
data is displayed as part of the preview of the 3D reconstruction of the
at least portion of the shape of the surface of the object.
```

```
The indication of the at least one of the quantity or the quality of the       ─616
data is displayed as the color of the preview of the portion of the
surface.
```

Figure 6A

THREE-DIMENSIONAL SCANNER WITH DATA COLLECTION FEEDBACK

RELATED APPLICATIONS

This application is a continuation application of International Application Serial No. PCT/IB2019/000989, filed Aug. 29, 2019, which claims priority to U.S. Provisional Application No. 62/733,588, filed Sep. 19, 2018, each of which is hereby incorporated by reference in its entirety.

TECHNICAL FIELD

The present invention relates generally to three-dimensional scanners and, more particularly, to three-dimensional scanners with data collection feedback.

BACKGROUND

Three-dimensional (3D) scanners are devices that build a 3D model of the surface of a physical object. Three-dimensional scanners have applications across many fields, including industrial design and manufacturing, computerized animation, science, education, medicine, art, design, and others.

SUMMARY

In some circumstances, it is beneficial for a 3D scanner to be handheld. For example, handheld 3D scanners have the potential to revolutionize archeological fieldwork. Consider the task of studying the structure of a delicate archeological sample discovered in a remote corner of the world. Without a handheld 3D scanner, the sample would need to be excavated, packaged in the field, transported over rough terrain, and studied in a laboratory. This process is laborious, time-consuming, and risks damaging the sample. With a handheld 3D scanner, the shape of the object can be scanned in the field, reducing or eliminating these problems.

Archeology is just one example. There are many other situations in which it is beneficial to be able to obtain a 3D model of an object without being in a laboratory or industrial setting. As another example, it is traditional to commission an official bust of each United States president. Previous presidents have had their busts taken using plaster, which required the president to breathe through straws in his nostrils while a thin layer of plaster dried on his face. In contrast, the data capture for Barack Obama's bust was completed in a couple of minutes using a pair of 3D scanners.

However, certain problems still exist. For example, one problem with 3D scanners is that it is difficult for the user to know in real-time whether he or she has collected enough data to obtain a quality 3D reconstruction. The user may get back to the laboratory, which may be, for example, thousands of miles from the archeological setting, only to realize that the data has gaps and that a full 3D model of the surface cannot be reconstructed. As a result, it often requires significant time to train a user to correctly use a 3D scanner, which limits the applicability of currently available 3D scanners.

The above deficiencies and other problems associated with 3D scanners are addressed by the disclosed devices and methods. In some embodiments, the device is a 3D scanner. In some embodiments, the device is a portable 3D scanner. In some embodiments, the device is a handheld 3D scanner. In some embodiments, the device has a display that provides feedback (e.g., while scanning an object) indicating a quality or quantity of data acquired (e.g., 3D data). In some embodiments, the device has a touch-sensitive display (also known as a "touch screen" or "touch-screen display"). In some embodiments, the device has a graphical user interface (GUI), one or more processors, memory and one or more modules, programs or sets of instructions stored in the memory for performing multiple functions. Executable instructions for performing these functions are, optionally, included in a non-transitory computer readable storage medium or other computer program product configured for execution by one or more processors.

In accordance with some embodiments, a method is performed at a three-dimensional (3D) scanner that is in communication with a display. The 3D scanner includes one or more optical sensors. The method includes scanning, using the one or more optical sensors, an object having a surface, wherein the scanning generates data corresponding to a 3D shape of at least a portion of the surface of the object. The method further includes generating, using the data, a 3D reconstruction of the at least portion of the shape of the surface of the object. The method further includes providing, to the display, a preview of the 3D reconstruction of the at least portion of the shape of the surface of the object. The method further includes providing, to the display, for rendering with the preview of the 3D reconstruction of the at least portion of the shape of the surface of the object, an indication of at least one of a quantity or a quality of the data corresponding to the 3D shape of the at least portion of the surface of the object.

In accordance with some embodiments, a three-dimensional (3D) scanner includes a housing, one or more lasers enclosed in the housing, one or more optical sensors enclosed in the housing and one or more processors enclosed in the housing. The one or more processors are in communication with the one or more lasers and the one or more optical sensors. The 3D scanner further includes memory storing instructions which, when executed by the one or more processors cause the 3D scanner to generate data corresponding to a 3D shape of at least a portion of a surface of an object by repeatedly performing the operations of projecting, using the one or more lasers, structured light toward the surface of the object; and, while projecting the structured light toward the surface of the object, acquiring, using the one or more optical sensors, an image of the surface of the object.

In accordance with some embodiments, a three-dimensional (3D) scanner includes one or more light sources; one or more optical sensors; a plurality of processors in communication with the one or more light sources and the one or more optical sensors; and memory. The memory stores instructions which, when executed by the plurality of processors cause the 3D scanner to generate data corresponding to a 3D shape of at least a portion of a surface of an object by repeatedly performing the operations of: projecting, using the one or more light sources, structured light toward the surface of the object; and while projecting the structured light toward the surface of the object, acquiring, using the one or more optical sensors, an image of the surface of the object. The 3D scanner includes a cooling manifold comprising a single piece of metal thermally coupled with the one or more light sources, the one or more optical sensors and the plurality of processors.

In accordance with some embodiments, a method is performed at a 3D scanner that includes one or more optical sensors. The method includes scanning, using the one or more optical sensors, an object having a surface. The scanning generates first data corresponding to a three-dimensional (3D) shape of the surface of the object. The method further includes, for each of a plurality of respective portions of the surface of the object, determining whether a quantity or quality of the first data meets a predefined threshold that corresponds to a quantity or quality of data needed to reconstruct the shape of the portion of the surface of the object to a predefined accuracy. The method further includes, after determining, for each respective portion of the plurality of portions of the surface of the object, whether the quantity or quality of the first data meets the predefined threshold that corresponds to a quantity or quality of data needed to reconstruct the shape of the portion of the surface of the object to the predefined accuracy, further scanning the object using the one or more optical sensors. The further scanning generates second data corresponding to the three-dimensional shape of the surface of the object. The method further includes discarding at least a portion of the second data, wherein the discarded portion of the second data corresponds to respective portions of the surface of the object for which the quantity or quality of the first data met the predefined threshold.

In accordance with some embodiments, a 3D scanner includes one or more light sources, one or more optical sensors, optionally a display, one or more processors, and memory storing one or more programs; the one or more programs are configured to be executed by the one or more processors and the one or more programs include instructions for performing or causing performance of the operations of any of the methods described herein. In accordance with some embodiments, a computer readable storage medium has stored therein instructions, which, when executed by a 3D scanner with one or more light sources, one or more optical sensors, optionally a display, and one or more processors, cause the 3D scanner to perform or cause performance of the operations of any of the methods described herein. In accordance with some embodiments, a graphical user interface on an 3D scanner with one or more light sources, one or more optical sensors, optionally a display, one or more processors, and memory storing one or more programs includes one or more of the elements displayed in any of the methods described herein, which are updated in response to inputs, as described in any of the methods described herein. In accordance with some embodiments, an electronic device includes: one or more light sources, one or more optical sensors, optionally a display, and means for performing or causing performance of the operations of any of the methods described herein.

Thus, 3D scanners are provided with improved methods and interfaces for data collection feedback during 3D scanning data acquisition, thereby increasing the effectiveness, efficiency, and user satisfaction with such devices.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIGS. 6A-6B illustrate a flow chart of a method for providing 3D data collection feedback from a 3D scanner, in accordance with some embodiments.

DESCRIPTION OF EMBODIMENTS

Figure 1A:
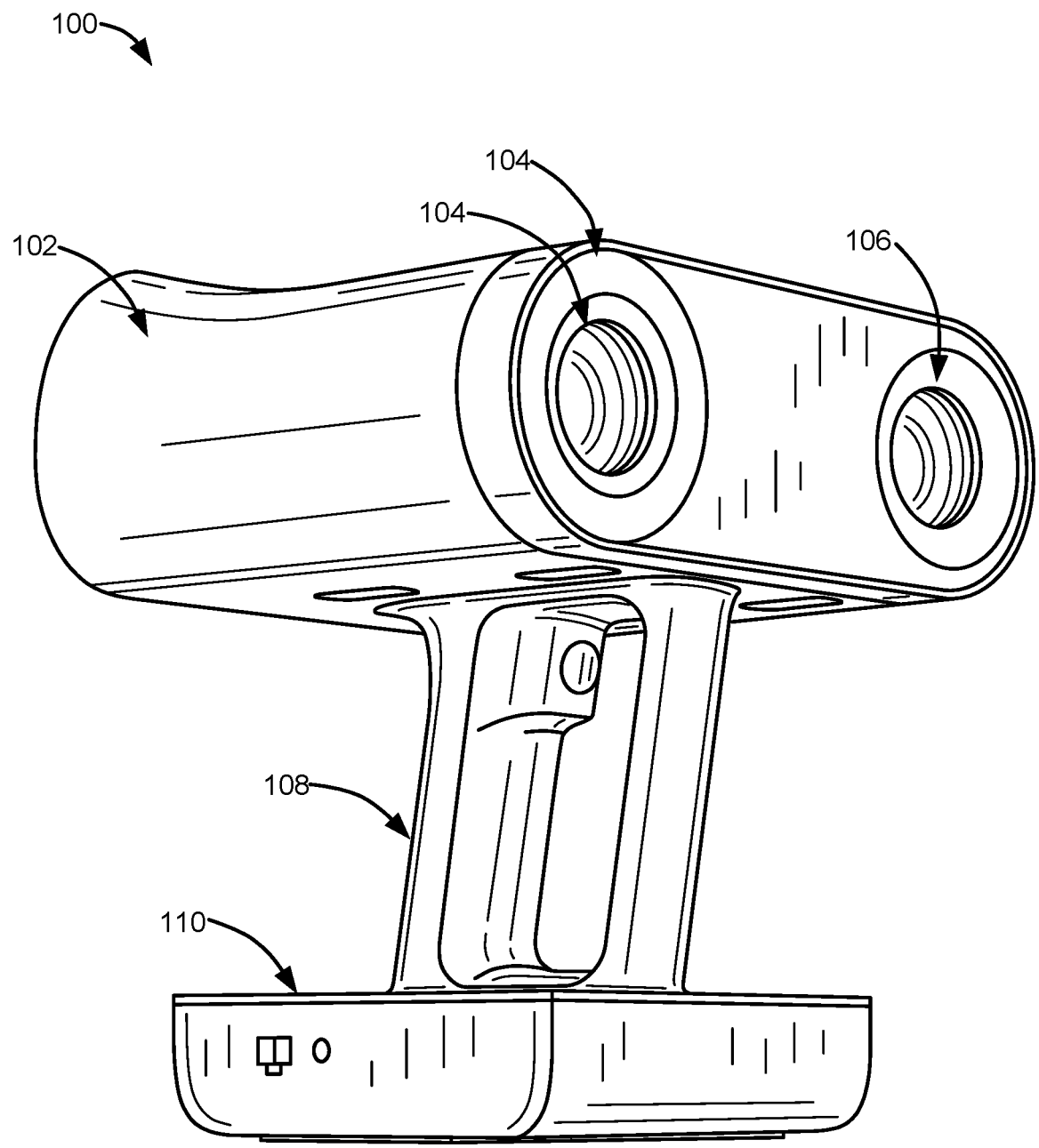
FIGS. 1A-1B illustrate various views of a 3D scanner, in accordance with some embodiments.

As described below, some embodiments provide a 3D scanner that provides data collection feedback. In some embodiments, while the user scans the object to collect data, the 3D scanner displays a preview of the 3D reconstruction of the object as well as an indication of the quality or quantity of the data (e.g., on a built-in display on the 3D scanner). The preview of the 3D reconstruction and the indication of the quantity or quality of the data are updated continuously, in real-time, as the user acquires more data. In some embodiments, the indication of the quality or the quantity of the data is overlaid on the 3D reconstruction of the object. For example, the 3D reconstruction of the object appears as a surface, and the color of the surface represents the quantity or quality of the data. The user can thus see, on the display, where there are gaps in the data. For example, when there is no data at all for a portion of the object, in some embodiments, the preview of the 3D reconstruction shows no surface at all for that area of the object. When there is some data for a portion of the object, but not enough to form an adequate reconstruction of that portion of the object, the 3D reconstruction of that portion of the object is rendered in red. Thus, the user can continue to acquire data until the preview of the object is completely filled with data of sufficient quantity or quality to fully reconstruct a 3D model of the object. In some embodiments, the sufficiency of quantity or quality of data to fully reconstruct a 3D model of the object is indicated by a different color. In some embodiments the different color is green.

Thus, a user can determine both when he or she has collected enough data and also can determine which portions of the object require more data collection. The latter feature allows the user to focus scanning on those portions of the object that require more data. Compared to disclosed embodiments, previous systems and methods of 3D scanning required the user to collect data without having sufficient feedback to know when enough data has been collected. As a result, to be safe, users would acquire an excessive amount of data, which resulted in excessive use of the scanner's memory and heat production within the scanner. The problem of excessive memory use and heat production made it difficult to produce a truly self-contained handheld 3D scanner (e.g., one capable of generated at least an initial 3D reconstruction), since the memory and heat-producing tasks would be delegated, usually by means of a wired connection, to an external computer. Thus, the disclosed embodiments improve 3D scanners by facilitating efficient collection of data, which in turn facilitates a smaller size of 3D scanner and their portability.

Further, some embodiments of the present disclosure provide handheld 3D scanners capable of operating in outdoor daylight conditions (e.g., obtaining a signal-to-noise ratio sufficient to reconstruct the 3D shape of an object) with lasers operating as class-1 lasers (e.g., safe under all conditions of normal use). The normal approach for assuring that lasers operate in the class-1 range is to enclose the laser in a large housing, such that by the time the light exits the housing, the light is attenuated enough to be considered class-1. This approach does not work for handheld scanners, since handheld scanners must have a relatively small size (e.g., less than 30 cm×30 cm×30 cm). Some embodiments of the present disclosure operate their light sources as class-1 through a suitable choice of pulse width, peak power, repetition rate, and/or duty cycle, such that the laser light is class-1 a relatively small distance from the laser (e.g., 25 cm).

Further, because of the way in which 3D data is obtained (e.g., stroboscopically producing light from a fairly powerful light source, as well as collecting and processing many images each second), heat production and removal is one of the biggest challenges in designing a handheld 3D scanner capable of previewing 3D reconstructions of objects in real-time. While maintaining a relatively cool temperature is important, maintaining a consistent temperature (both spatially and temporally) is at least equally important. To that end, some embodiments provide a cooling manifold comprising a single piece of metal thermally coupled with the scanner's light sources, optical sensors and processors. The cooling manifold maintains various components of the scanner at a consistent and stable temperature by providing thermal connectivity between the primary heat-generating components of the scanner. Thus, the cooling manifold reduces the "warm-up" time needed for the scanner to reach a stable temperature, allows for greater processing power, and increases the amount of time the scanner can collect data.

A further challenge in designing 3D scanners is that 3D scanners produce an immense amount of data during scans. Some embodiments improve the process of storing data from a 3D scanner by identifying regions of an object being scanned for which sufficient data has already been collected. These embodiments then discard some or all of the data collected for those regions as the scan continues. Thus, these embodiments reduce the entire amount of data collected while scanning an object, which improves the device by reducing the amount of storage needed for the device, or alternatively, allowing the device's storage to be used where it is needed most, resulting in higher quality 3D reconstructions.

Reference will now be made to embodiments, examples of which are illustrated in the accompanying drawings. In the following description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure inventive aspects of the embodiments.

Figure 1B:
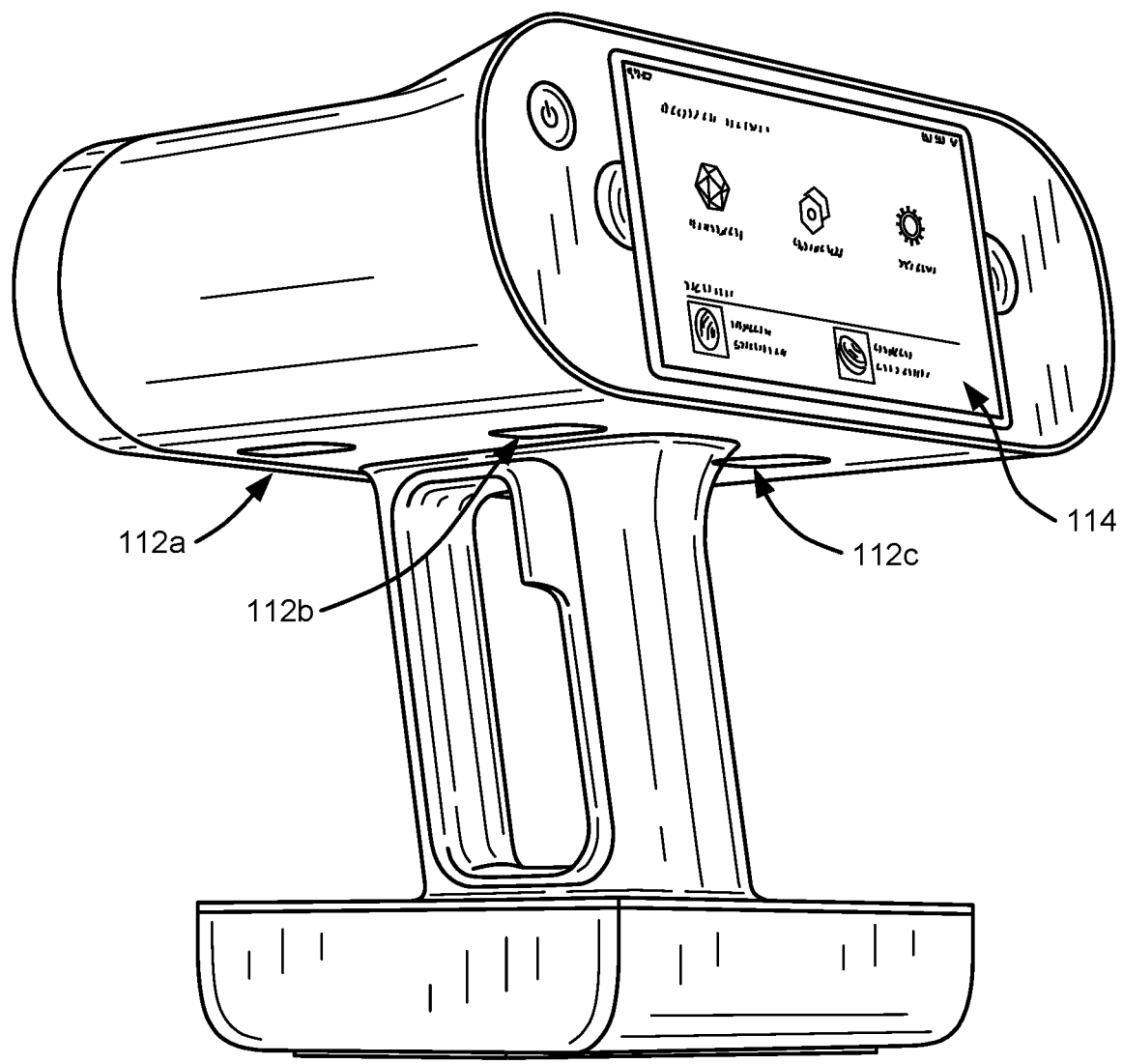

FIGS. 1A-1B illustrate various views of a 3D scanner 100, in accordance with some embodiments. Scanner 100 includes a main body housing 102, a handle 108, and a battery housing 110 (e.g., which contains a battery). In some embodiments, 3D scanner 100 is a portable, handheld scanner. To that end, in some embodiments, 3D scanner 100 has dimensions less than 30 cm×30 cm×30 cm (e.g., fits inside a box with dimensions 30 cm×30 cm×30 cm). In some embodiments, 3D scanner 100 is sufficiently light to be carried by a person with one hand (e.g., 3D scanner 100 weighs about 2.5 kg).

In some embodiments, the main body housing 102 can be separated from the handle 108. In some embodiments, the main body housing 102 can be mounted (e.g., without the handle 108 and battery housing 110) to a separate apparatus (e.g., a robotic motorized scanning arm) via mounting points 112 (e.g., mounting point 112-$a$ through mounting point 112-$c$). Thus, 3D scanner 100 can be converted from a handheld scanner to an industrial or laboratory scanner.

In some embodiments, 3D scanner 100 generates a 3D model of an object by projecting a spatial pattern of light (referred to herein as "structured light") onto the surface of the object, and, while the spatial pattern of light is projected onto the surface of the object, acquiring, using an optical sensor (e.g., a camera), an image of the surface of the object. To that end, the main body housing 102 houses one or more internal light sources (e.g., vertical cavity surface-emitting laser (VCSEL) 506, FIG. 5) and source optics 104. The one or more internal light sources project light stroboscopically (e.g., project pulsed light), at a particular frequency, through a spatially-patterned slide internal to the main body housing 102 (e.g., slide 516, FIG. 5), through source optics 104, onto the surface of the object. Images of the structured light projected onto the surface of the object are acquired through camera optics 106 housed by the main body housing 102. One or more cameras/sensors (e.g., charge-coupled device (CCD) detectors 502, FIG. 5) record the images of the structured light projected onto the surface of the object. A 3D model of the shape of the surface of the object can be determined by distortions in the pattern of the light projected onto the surface of the object (i.e., where the distortions are caused by the shape of the surface of the object), as described in greater detail in U.S. Pat. No. 7,768,656, entitled "System and Method for Three-Dimensional Measurement of the Shape of Material Objects," which is hereby incorporated by reference in its entirety.

In some embodiments, the internal light sources are lasers. In some embodiments, the internal light sources are vertical-cavity surface-emitting lasers (VCSELs). In some embodiments, 3D scanner 100 operates as a class-1 light source, meaning that the lasers are considered class-1 everywhere outside of the main body housing 102 (i.e., as defined by 21 Code of Federal Regulations (CFR) Part 1040 as of the filing date of this disclosure).

Note that, in some embodiments, scanner 100 provides sufficient illumination of the surface of the object so that images acquired in outdoor daylight conditions have a signal-to-noise ratio sufficient to reconstruct the 3D shape of at least the portion of the object (e.g., with an accuracy of at least 0.1 mm, 0.2 mm, 0.3 mm, 0.4 mm, or 0.5 mm; or, alternatively, with a resolution of 0.25 mm, 0.5 mm, 0.75 mm, or 1 mm). The normal approach for assuring that lasers operate in the class-1 range is to enclose the laser in a large housing, such that by the time the light exits the housing, the light is attenuated enough to be considered class-1. This approach does not work for handheld scanners, since handheld scanners must have a relatively small size (e.g., less than 30 cm×30 cm×30 cm). Some embodiments of the present disclosure operate the light sources enclosed in the main body housing 102 as class-1 through a suitable choice of pulse width, peak power, repetition rate, and/or duty cycle, allowing scanner 100 to be handheld, safe, and operable in normal daylight conditions (e.g., at 120,000 lux, 100,000 lux, 20,000 lux, 2,000 lux, or 1,000 lux). This also allows scanner 100 to have a relatively short minimum working distance (e.g., a minimum working distance that is no greater than 35 mm).

In addition, to increase the signal to noise from the structured light data, and to differentiate structured light data from texture (e.g., color) data, in some embodiments, the VCSEL lasers described above are operated at a frequency outside of the visible spectrum (e.g., an infrared (IR) frequency). In such embodiments, the main body housing 102 encloses, in addition to a camera lens (e.g., camera optics 106), an IR/visible beam splitter, which directs IR light to a first optical sensor (e.g., CCD detector 502-a, FIG. 5) and visible light to a second optical sensor (e.g., CCD detector 502-b, FIG. 5). In some embodiments, data from the first optical sensor is detected synchronously with the stroboscopic light from the one or more internal light sources so that data at the stroboscopic frequency is detected preferentially to information at other frequencies. This can be done, for example, using synchronous demodulation or by gating the first optical sensor to collect data synchronously with the one or more light sources producing light.

In some embodiments, the second optical sensor enclosed in main body housing 102 (e.g., CCD detector 502-b, FIG. 5) acquires texture data (e.g., color data). In some embodiments, texture data is used both to render the 3D reconstruction in color (e.g., when color is not used to provide feedback as to quantity or quality of data, as described below) as well to track the position and/or rotation of the scanner 100 (e.g., through image analysis and registration), which is in turn used to register (e.g., align) the structured light data (e.g., the 3D shape data) taken by the scanner 100 at different positions with respect to the object (e.g., as described below with reference to FIG. 3).

The main body housing 102 also encloses one or more movement sensors that track movement of the scanner 100. The one or more movement sensors optionally include a 3-axis accelerometer, 3-axis gyroscope, and/or 3-axis magnetometer to measure position and/or rotation of the scanner 100. In some embodiments, the one or more movement sensors include all three of a 3-axis accelerometer, a 3-axis gyroscope, and a 3-axis magnetometer, and is thus referred to as a nine (9) degree of freedom (DOF) sensor, despite the fact that scanner 100 has only six mechanical degrees of freedom (i.e., three positional, and three rotational degrees of freedom). The position and/or rotation data from the one or more movement sensors is used to track the position and/or rotation of the scanner 100 (e.g., through application of a Kalman filter), which is in turn used to register (e.g., align) the structured light data (e.g., the 3D shape data) taken by the scanner 100 at different positions with respect to the object (e.g., as described below with reference to FIG. 3).

To facilitate onboard automatic processing (e.g., to produce at least an initial 3D reconstruction of an object), in order to give users a fully mobile scanning experience, in some embodiments, the main body housing 102 houses a plurality of processors, including one or more field-programmable gate arrays, one or more graphical processing units (GPUs), and/or one or more CPUs. These components, and the tasks performed by each are discussed in greater detail with reference to FIGS. 2-3. At this point, it is sufficient to note that the main body housing 102 contains sufficient processing to generate at least an initial reconstruction of the 3D model of the object (e.g., a preview of the 3D model of the object).

The main body housing 102 further houses a display 114 that displays a graphical user interface for scanner 100. Among other things, as scanner 100 scans an object, the graphical user interface for scanner 100 displays an initial 3D reconstruction of the object (e.g., a preview of the 3D reconstruction of the object). In some embodiments, the display 114 is a touch-sensitive display (sometimes called a touch-screen) and thus can also receive user inputs (e.g., to begin a scan, pause a scan, end a scan, and otherwise control scanner 100).

Figure 2:
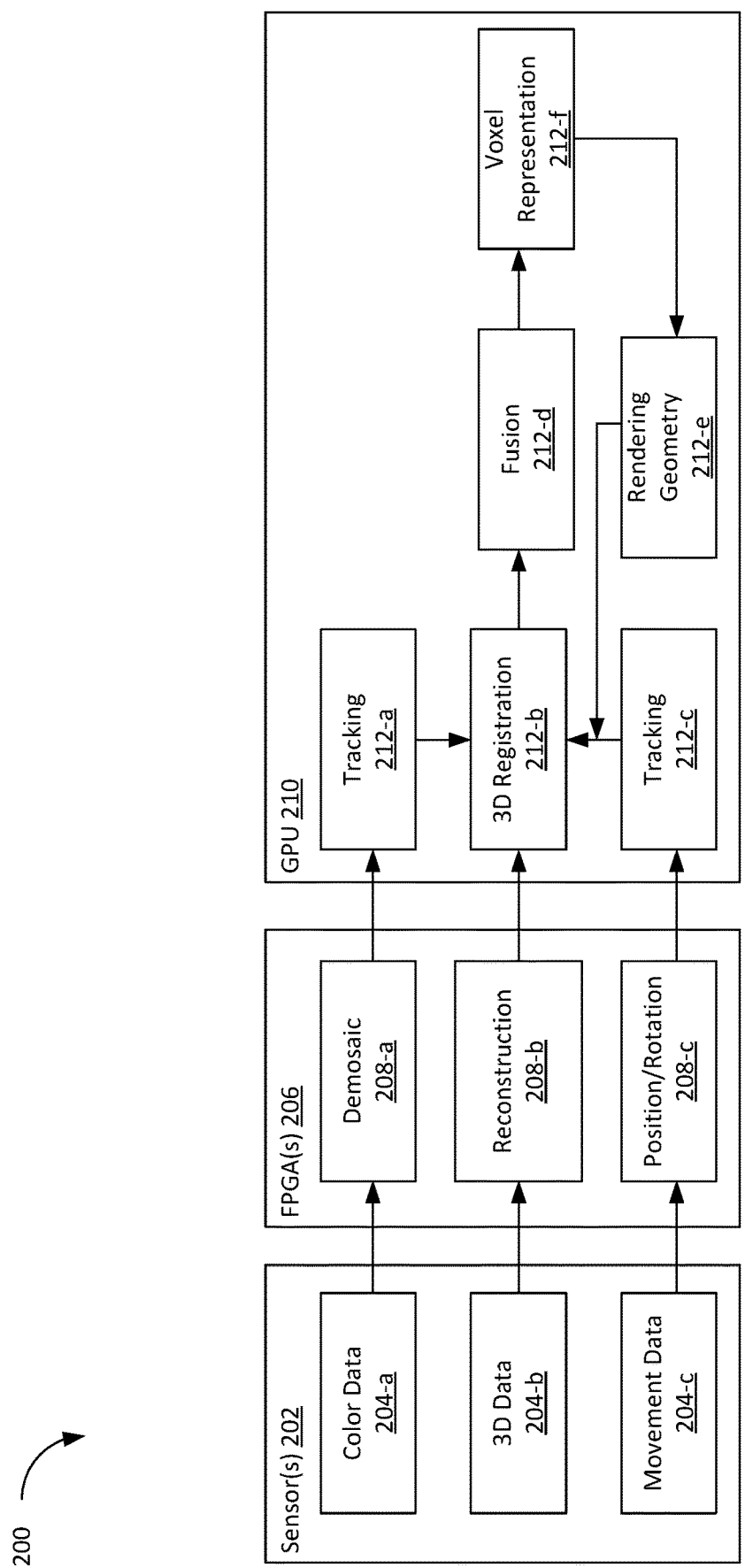
FIG. 2 is a flow chart of a method for analyzing 3D data from a 3D scanner, performed while the 3D data is being acquired, in accordance with some embodiments.

FIG. 2 is a flow chart of a method 200 for analyzing 3D data from a 3D scanner, performed while the 3D data is being acquired, in accordance with some embodiments. Method 200 is performed at a 3D scanner (e.g., 3D scanner 100, FIGS. 1, 3, and 5). Some operations in method 200 are, optionally, combined and/or the order of some operations is, optionally, changed. For ease of explanation, method 200 is described as being performed by 3D scanner 100. However, method 200 can be carried out using any 3D scanner built in accordance with the instant disclosure. Conversely, in other embodiments, 3D scanner 100 performs methods other than method 200 in accordance with the teachings of the instant disclosure. In some embodiments, method 200 is performed continuously, in real-time, while 3D data is being acquired. In some embodiments, method 200 results in a preview of a 3D reconstruction of the shape of an object, which is displayed on the display of the 3D scanner while the user is acquiring data (e.g., the preview of the 3D reconstruction of the shape of the object is generated continuously, in real-time, and updates as the scanner 100 acquires additional data from sensors 202).

Scanner 100 acquires data from a plurality of sensors 202. For example, a first optical sensor collects texture (e.g., color) data 204-a (e.g., a first CCD detector, such as CCD detector 502-a, FIG. 5), a second optical sensor collects 3D data 204-b (e.g., a second CCD detector, such as CCD detector 502-b, FIG. 5), and a motion sensor collects movement data 204-c (e.g., a 9 DOF sensor, which may be implemented using microelectromechanical systems (MEMS), gyroscopes or other motion detecting systems and one or more Hall sensors). In some embodiments, the data from the plurality of sensors 202 is obtained concurrently during a scan. Concurrently, as used herein, means that measurements from two sensors 202 are obtained in fast enough succession that a measurement from a first sensor 202 and a measurement from a second sensor 202 can be consider to have been acquired at the same time (e.g., for the purposes of tracking operations 212-a and 212-c, described below).

Scanner 100 performs one or more first processing operations on the data acquired from the sensors 202. In some embodiments, the first processing operations are performed by one or more field programmable gate arrays (FPGAs) 206. For simplicity, the first processing operations are described herein as being performed by a single FPGA 206, although in some embodiments, the operations may be split across a plurality of FPGAs.

For example, an FPGA 206 receives the 3D data 204-b from the first optical sensor and generates a reconstruction 208-b representing the shape of the surface of the object. In some embodiments, a reconstruction 208-b is a data structure containing data for a three-dimensional array of points (e.g., reconstruction 208-b is a point cloud reconstruction of the shape of the surface of the object, and not yet a mesh). In some embodiments, the FPGA 206 generates a reconstruction 208-b for each image acquired by the first optical sensor (e.g., where each image corresponds to a pattern of structured light shone on and distorted by the surface of the object). Thus, in some embodiments, the FPGA 206 generates a plurality of representations of the shape of the surface of the object, where the representations of the plurality of representations are not yet aligned (e.g., registered) with each other.

In some embodiments, the FPGA 206 receives the color data 204-a from the second optical sensor. The color data 204-a is used to generate a demosaic 208-a. In some embodiments, the FPGA 206 receives a plurality of color images of the surface of the object. In some embodiments, as described elsewhere in this document, the 3D data and the color images are obtained stroboscopically at different times (e.g., interlaced with one another).

In some embodiments, the FPGA 206 receives the movement data 204-c and applies a Kalman filter to the movement data to determine a position and/or rotation 208-c of the scanner 100. In some embodiments, the position and/or rotation 208-c of the scanner 100 is determined with respect to a reference position and/or rotation. In some embodiments, the reference position and/or rotation is the position and/or rotation of the scanner 100 when the scan began. In some embodiments, the reference position and/or rotation is with respect to the object being measured.

The Kalman filter operates under the assumption that movement data 204-c is noisy and contains errors. Essentially, the Kalman filter smooths the movement data 204-c to determine the position and/or rotation 208-c of the scanner 100 in a way that is more accurate than taking the raw measured position and/or rotation as the actual value of the position and/or rotation of the scanner 100. To that end, the determined position and/or rotation 208-c of the scanner 100 is a function of a plurality of measured positions and/or rotations of the scanner 100, as measured by the sensors 202 (e.g., as measured by the 9 DOF sensor). When a new measurement of position and/or rotation is received by the FPGA 206, the new measurement of position and/or rotation is used to update, rather than completely override, the existing determined position and/or rotation 208-c of the scanner 100. For example, the plurality of existing measured positions and/or rotations of the scanner 100 is used to determine a velocity (e.g., and/or angular velocity) of the scanner 100. The velocity and/or angular velocity of the scanner 100 is used to determine an interpolated position and/or rotation of the scanner 100, which is weighed with the new measured position and/or rotation to produce the determined position and/or rotation 208-c of the scanner 100. In some embodiments, the weight of the interpolated position and/or rotation, relative to the weight of the measured position and/or rotation, depends on the variability of recent measured positions (e.g., the last 10 measurements), which is taken as an indication of the noise of the last 10 measurements.

Scanner 100 performs one or more second processing operations on the results of the first processing operations. In some embodiments, the second processing operations are performed by one or more graphical processing units 210. In some embodiments, the graphical processing units (GPUs) 210 receive the results of the first processing operations from FPGAs 206. For simplicity, the second processing operations are described herein as being performed by a single GPU 210, although in some embodiments, the operations may be split across a plurality of GPUs 210.

In some embodiments, the GPU 210 applies two tracking operations (tracking operations 212-a and 212-c), which are used to perform 3D registration (e.g., alignment) 212-b of the reconstructions 208-b. The 3D registration 212-b shifts respective reconstructions 208-b (e.g., point clouds) onto a common reference frame. For example, in some embodiments, the common frame of reference is a frame of reference of an existing voxel representation 212-f of the surface of the object (e.g., the reconstructions 208-b are shifted onto the rendering geometry 212-e of the existing object). Note that, although the terms registration and alignment are used interchangeably, it should be understood that, in some embodiments, additional alignment and other post-processing are performed optionally offline after a scan is completed.

Note that reconstructions 208-b and voxel representation 212-f are both examples of "3D reconstructions" of a shape of a surface of an object. That is, a 3D reconstruction of a shape of a surface of an object may be a point cloud, a voxel representation, or any other type of reconstruction.

Tracking operation 212-a analyzes the demosaics 208-a to identify corresponding features in the demosaics. The corresponding features are then used to determine a relative shift to apply between a first demosaic and a second demosaic so as to shift the first demosaic onto a common frame of reference as the second demosaic (e.g., by performing image alignment and registration). The relative shift between the first demosaic and the second demosaic is then used to determine a relative shift between a first reconstruction (e.g., corresponding to, and acquired at substantially the same time as, the first demosaic) and a second reconstruction (e.g., corresponding to, and acquired at substantially the same time as, the second demosaic).

Similarly, tracking operation 212-c uses the determined positions and/or rotations 208-c of the scanner 100 to determine relative shifts between reconstructions 208-b. For example, a relative shift between a first reconstruction (e.g., corresponding to, and acquired at substantially the same time as, a first determined position and/or rotation of scanner 100) and a second reconstruction (e.g., corresponding to, and acquired at substantially the same time as, a second determined position and/or rotation of scanner 100) is determined.

In some embodiments, the relative shifts from tracking operations 212-a and 212-c are used (e.g., weighted against each other) at 3D registration 212-b to determine an overall relative shift to apply to each reconstruction 208-b, such that the shifted reconstructions 208-b are placed onto a common frame of reference.

GPU 210 performs a fusion operation 212-d in which the shifted reconstructions 208-b produced by the 3D registration operation 212-b are merged into a single fused voxel representation 212-f (which may be an existing voxel representation generated from previously-acquired data). For example, fusion operation 212-d produces an average (or weighted average) of the shifted reconstructions to generate the fused voxel representation 212-f of the 3D shape of the surface of the object. In some embodiments, the fused voxel representation 212-f is updated in real-time as additional data is acquired (e.g., by shifting additionally-acquired reconstructions 208-b onto the frame of reference of the fused voxel representation of the 3D shape of the surface of the object, and then merging the additionally-acquired reconstructions 208-b with the fused voxel representation to produce an updated fused voxel representation).

Each point in the voxel representation 212-f is referred to as a voxel and represents a volume of three-dimensional space (e.g., in contrast to a pixel, which represents an area of two-dimensional space). In some embodiments, each voxel in the voxel representation 212-f includes a value that indicates whether the voxel represents the surface of the object (e.g., a "1" if the voxel represents the surface of the object and a "0" if the voxel does not).

In some embodiments, the fused voxel representation 212-*f* also stores, for each voxel, statistical information corresponding to the quality and/or quantity of data collected for that voxel. The statistical information corresponding to the quality and/or quantity of data is used to display a real-time indication of the quantity and/or quality of the data, as described below with reference to method 600.

In some embodiments, texture (e.g., color) from the demosaics 208-*a* is added to the fused voxel representation 212-*f* To do so, texture data from the demosaics 208-*a* undergoes color unification (e.g., in which common points are identified in the demosaics 208-*a* and the texture data shifted so that the common points have the same color) and color calibration (e.g., in which balance and brightness of the demosaics 208-*a* are calibrated across the demosaics 208-*a*). The unified, calibrated demosaic information is then added to the fused voxel representation 212-*f* produced by fusion operation 212-*d* to produce a textured fused voxel representation. The textured fused voxel representation is rendered and displayed on the display (e.g., display 114, FIG. 1B) as a real-time preview of the 3D reconstruction of the object.

Figure 3:
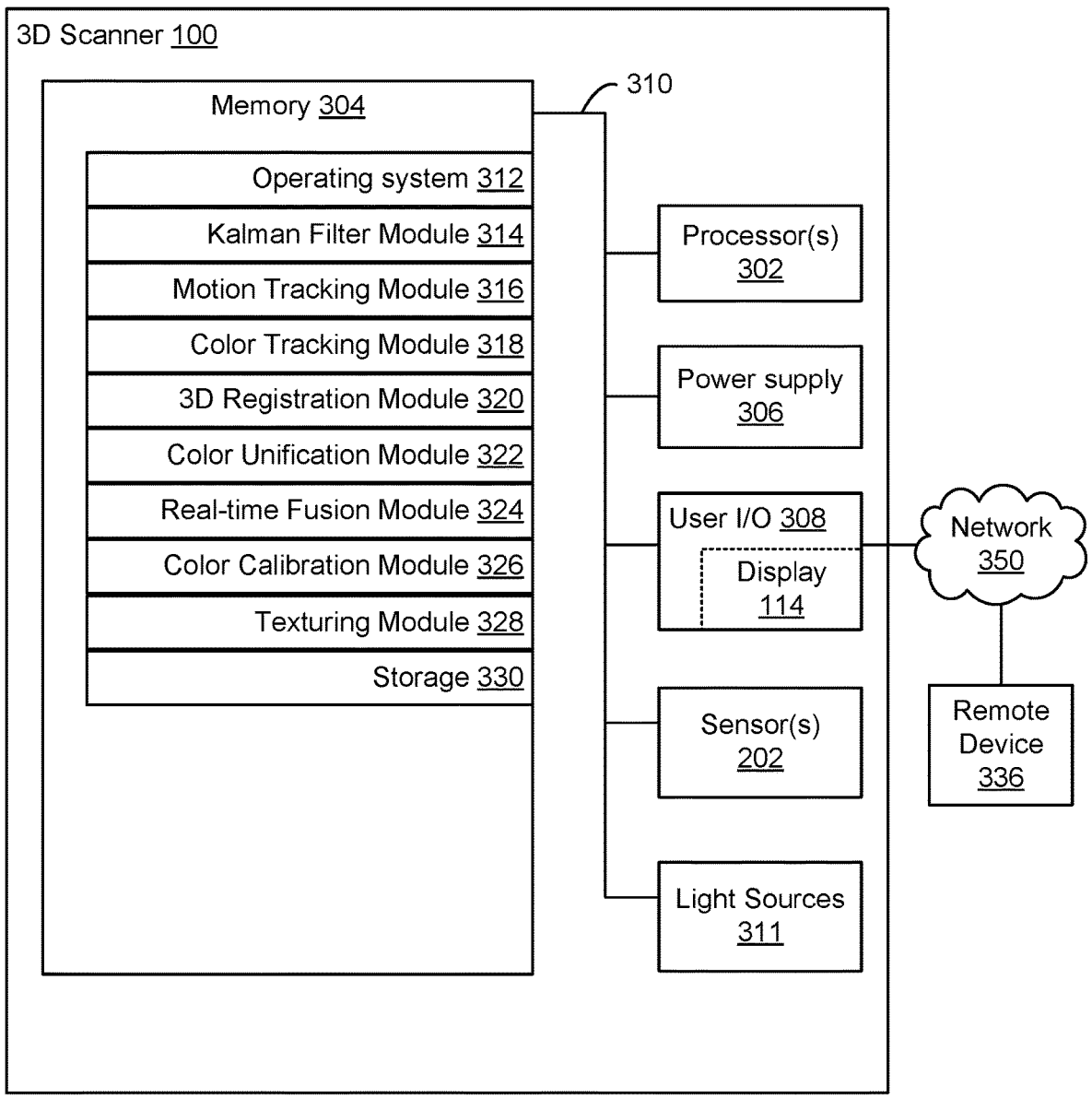
FIG. 3 is a block diagram of a 3D scanner, in accordance with some embodiments.

FIG. 3 is a block diagram of 3D scanner 100, in accordance with some embodiments. Scanner 100 typically includes memory 304, one or more processor(s) 302, a power supply 306, user input/output (I/O) subsystem 308, sensors 202, light sources 311, and a communication bus 310 for interconnecting these components. The processor(s) 302 execute modules, programs, and/or instructions stored in memory 304 and thereby perform processing operations.

In some embodiments, the processor(s) 302 include at least one graphical processing unit (e.g., GPU 210, FIG. 2). In some embodiments, the processor(s) 302 include at least one field programmable gate array (e.g., FPGA 206, FIG. 2).

In some embodiments, memory 304 stores one or more programs (e.g., sets of instructions) and/or data structures. In some embodiments, memory 304, or the non-transitory computer readable storage medium of memory 304 stores the following programs, modules, and data structures, or a subset or superset thereof, some of which include instructions for performing the corresponding operations described above with reference to FIG. 2:
- an operating system 312;
- a Kalman filter module 314;
- a motion tracking module 316;
- a color tracking module 318;
- a color unification module 320;
- a fusion module 324;
- a color-calibration module 326;
- a texturing module 328; and
- storage 330 including buffer(s), RAM, ROM, and/or other memory that stores data used and generated by scanner 100.

The above identified modules (e.g., data structures and/or programs including sets of instructions) need not be implemented as separate software programs, procedures, or modules, and thus various subsets of these modules may be combined or otherwise rearranged in various embodiments. In some embodiments, the memory 304 stores a subset of the modules identified above. Furthermore, the memory 304 may store additional modules not described above. In some embodiments, the modules stored in the memory 304, or a non-transitory computer readable storage medium of the memory 304, provide instructions for implementing respective operations in the methods described below. In some embodiments, some or all of these modules may be implemented with specialized hardware circuits (e.g., FPGAs 206, FIG. 2) that subsume part or all of the module functionality. One or more of the above identified elements may be executed by one or more of the processor(s) 302.

In some embodiments, the I/O subsystem 308 communicatively couples the scanner 100 to one or more devices, such as one or more remote device(s) 336 (e.g., an external display) via a communications network 350 and/or via a wired and/or wireless connection. In some embodiments, the communications network 350 is the Internet. In some embodiments, the I/O subsystem 308 communicatively couples the scanner 100 to one or more integrated or peripheral devices, such as touch-sensitive display 114.

In some embodiments, sensors 202 include a first optical sensor that collects 3D data (e.g., a first CCD detector, such as CCD detector 502-*a*, FIG. 5), a second optical sensor that collects texture (e.g., color) data (e.g., a second CCD detector, such as CCD detector 502-*b*, FIG. 5), and a motion sensor (e.g., a 9 DOF sensor, which may be implemented using microelectromechanical systems (MEMS), gyroscopes, and one or more Hall sensors).

In some embodiments, light sources 311 include one or more lasers. In some embodiments, the one or more lasers comprise vertical-cavity surface-emitting lasers (VCSELs). In some embodiments, light sources 311 also include an array of light emitting diodes (LEDs) that produce visible light.

The communication bus 310 optionally includes circuitry (sometimes called a chipset) that interconnects and controls communications between system components.

FIGS. 4A-4F illustrate example user interfaces for providing 3D data collection feedback on a 3D scanner (e.g., 3D scanner 100, FIGS. 1 and 3), in accordance with some embodiments. In some embodiments, the user interfaces shown in FIGS. 4A-4F are displayed and updated in real-time during a scan of an object (e.g., as the scanner 100 collects data, as described above with reference to FIG. 2). In some embodiments, the user interfaces shown in FIGS. 4A-4F are displayed on a display that is integrated into the 3D scanner. In some embodiments, the user interfaces shown in FIGS. 4A-4F are displayed on a remote display that is in communication with the 3D scanner (e.g., the 3D scanner wirelessly transmits, to the remote display, information to display the user interfaces shown in FIGS. 4A-4F).

Figure 4A:
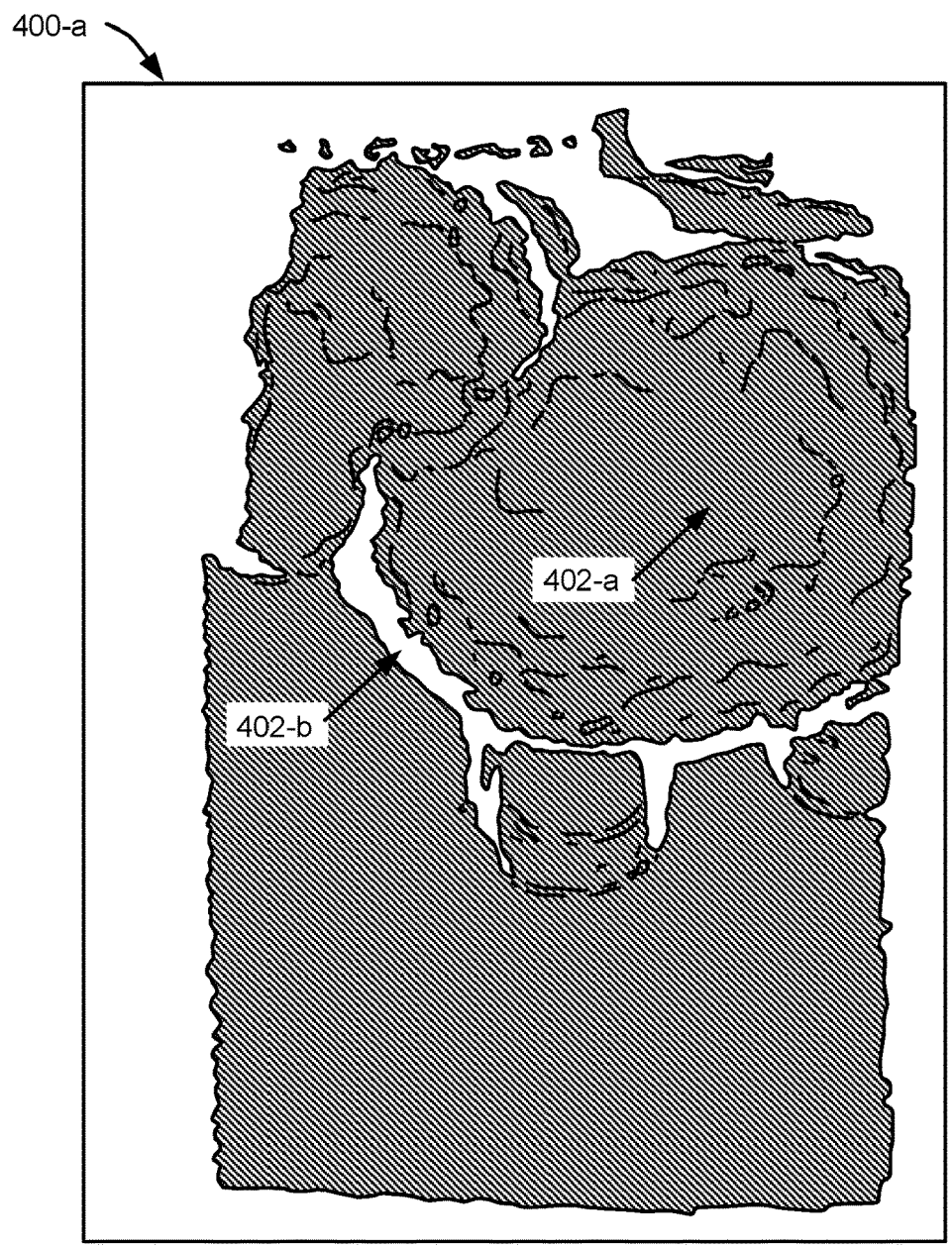
FIGS. 4A-4F illustrate example user interfaces for providing 3D data collection feedback on a 3D scanner, in accordance with some embodiments.

FIG. 4A illustrates a user interface displaying a preview 400-*a* of a 3D reconstruction of the at least portion of the shape of the surface of the object. In this case, the object is a porcelain sheep. The preview 400-*a* illustrates the 3D reconstruction of the portion of the shape of the surface of the object at a first time (e.g., includes all of the data acquired during the scan up until the first time).

Note that previews labeled with the same number (e.g., 400) correspond to the same preview, (i.e., a single preview displayed over the course of a scan). To refer to a snapshot of the preview at a particular time, a letter is appended to the number (e.g., as is the case above with the preview 400-*a*.

In addition, the user interface displays an indication of at least one of a quantity or a quality of the data corresponding to the 3D shape of the surface of the object. For example, the indication of the at least one of the quantity or the quality of the data is displayed as part of the preview 400-*a* of the 3D reconstruction of the at least portion of the shape of the surface of the object (e.g., the indication of the at least one of the quantity or the quality of the data is displayed as the color of the preview 400-*a* of the portion of the surface). In some embodiments, each respective point in the preview 400 that represents the surface of the object (e.g., each voxel that represents the surface of the object) displays a corresponding indication of the quality and/or quantity of data for that respective point (e.g., respective voxel). Thus, in some embodiments, the preview 400 provides a 3D visualization of the quantity and/or quality of data over the surface of the object.

In the example shown in FIGS. 4A-4D, portions of preview 400 having different quantities and/or qualities of data are displayed with different fill patterns (e.g., according to the legend provided in the figures). Alternatively, portions of preview 400 having different quantities and/or qualities of data are displayed with different colors. For example, portions of preview 400 having different quantities and/or qualities of data are displayed according to a color scale, which may be nearly continuous (e.g., having 256 different colors representing different quantities and/or qualities of data). For example, the portions of the preview 400 having a small amount of data and/or a poor (low quality) data quality may be displayed in red. The portions of the preview 400 having more data and/or better (medium) quality data may be shown in yellow. However, the portions of the preview 400 shown in yellow may have insufficient data to reconstruct the object according to predefined accuracy specifications. The portions of the preview 400 having a high quantity data and/or better quality data may be shown in green. In some embodiments, a high quantity/quality of data indicates that the object can be reconstructed with predefined accuracy specifications (e.g., with an accuracy of at least 0.1 mm, 0.2 mm, 0.3 mm, 0.4 mm, or 0.5 mm; or, alternatively, with a resolution of 0.25 mm, 0.5 mm, 0.75 mm, or 1 mm). In other embodiments, colors and/or shades of colors other than red, yellow, and green and/or fewer or more colors are used to provide feedback regarding quantity and/or quality of the collected data to the user. In one embodiment, a single color in one or more shades is used to provide a feedback regarding quantity and/or quality of the collected data to the user. In another embodiment, two or more colors are used to provide a feedback regarding quantity and/or quality of the collected data to the user.

In the example shown in FIG. 4A, portion 402-*a* of preview 400-*a* has sufficient data to determine a location of the surface of the object, but the data is otherwise insufficient and/or poor. This allows the user to see, in real-time, where data is insufficient and/or of poor quality.

In some circumstances, other portions of the surface of the object, for example portion 402-*b*, may have no data at all (and thus no location is determined). These portions are rendered as gaps in the preview 400-*a* of the 3D reconstruction of the surface of the object. This allows the user to see, in real-time, where data is missing from the scan.

Figure 4B:
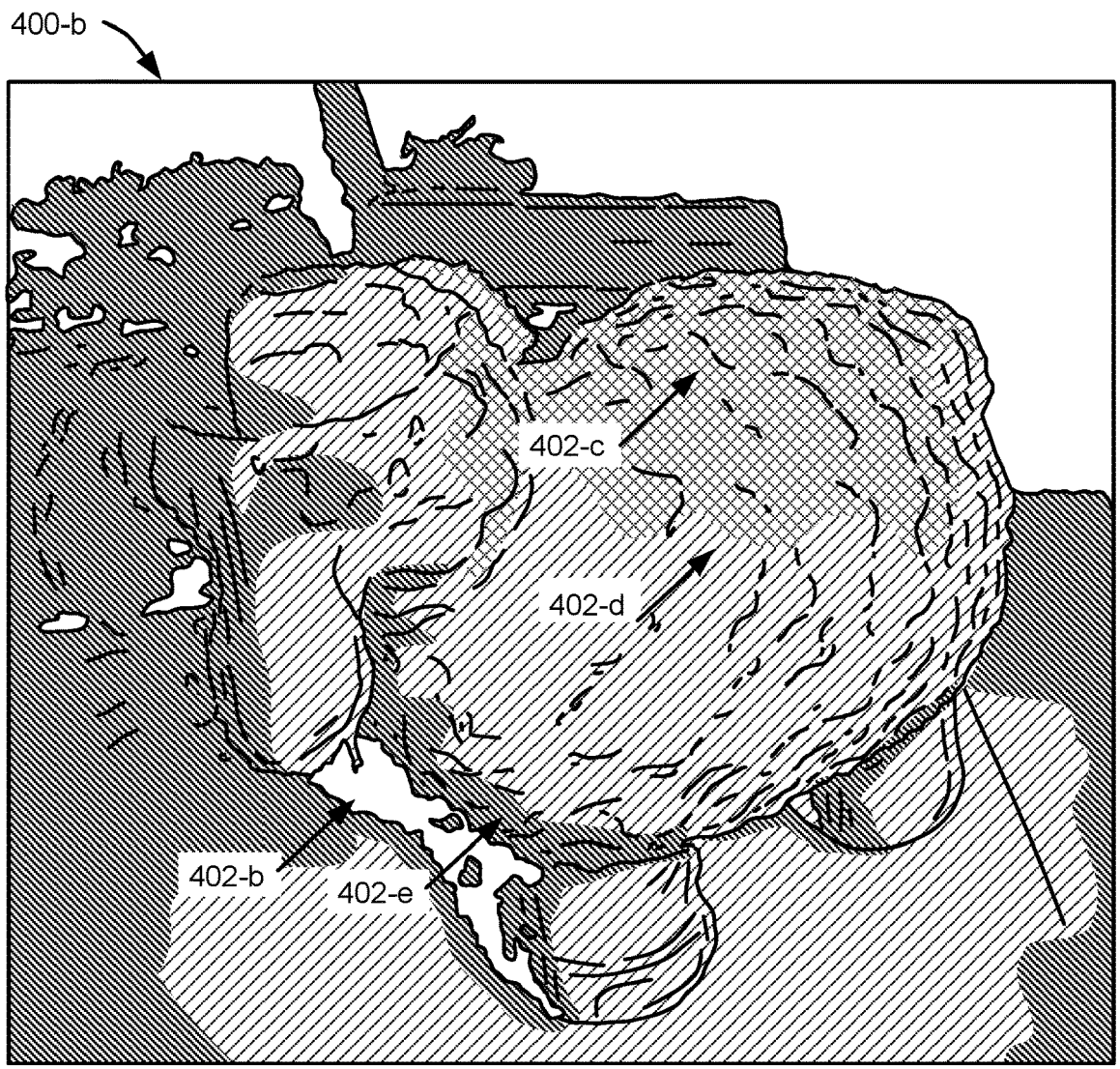
Figure 4B:
Figure 4B:
Figure 4B:
Figure 4B:

FIG. 4B illustrates the user interface displaying preview 400-*b* of the 3D reconstruction of the shape of the surface of the object. The preview 400-*b* is an update of preview 400-*a*. That is, preview 400-*b* illustrates the 3D reconstruction of the portion of the shape of the surface of the object at a second time that is later than the first time (e.g., includes all of the data acquired during the scan up until the second time). Thus, more data has been acquired for preview 400-*b* as compared to preview 400-*a*. As a result, preview 400-*b* illustrates regions with more and/or improved data as compared to preview 400-*a*. For example, portion 402-*c* is displayed in a fill pattern indicating high quantity and/or quality of data (e.g., indicating adequate data for that region of the object); portion 402-*d* is displayed in a fill pattern indicating medium quantity and/or quality of data (e.g., indicating that the data for that region of the object is better than it was in preview 400-*b*, but still insufficient); and portion 402-*e* is displayed in a fill pattern indicating low quantity and/or quality of data (e.g., indicating insufficient and/or poor quality data for that region of the object). Portion 402-*b* still indicates a gap in data. Thus, the preview 400-*b* suggests to a user where to reposition the scanner to complete the scan (e.g., the user should move the scanner to face the missing and/or poor data regions more directly).

Figure 4C:
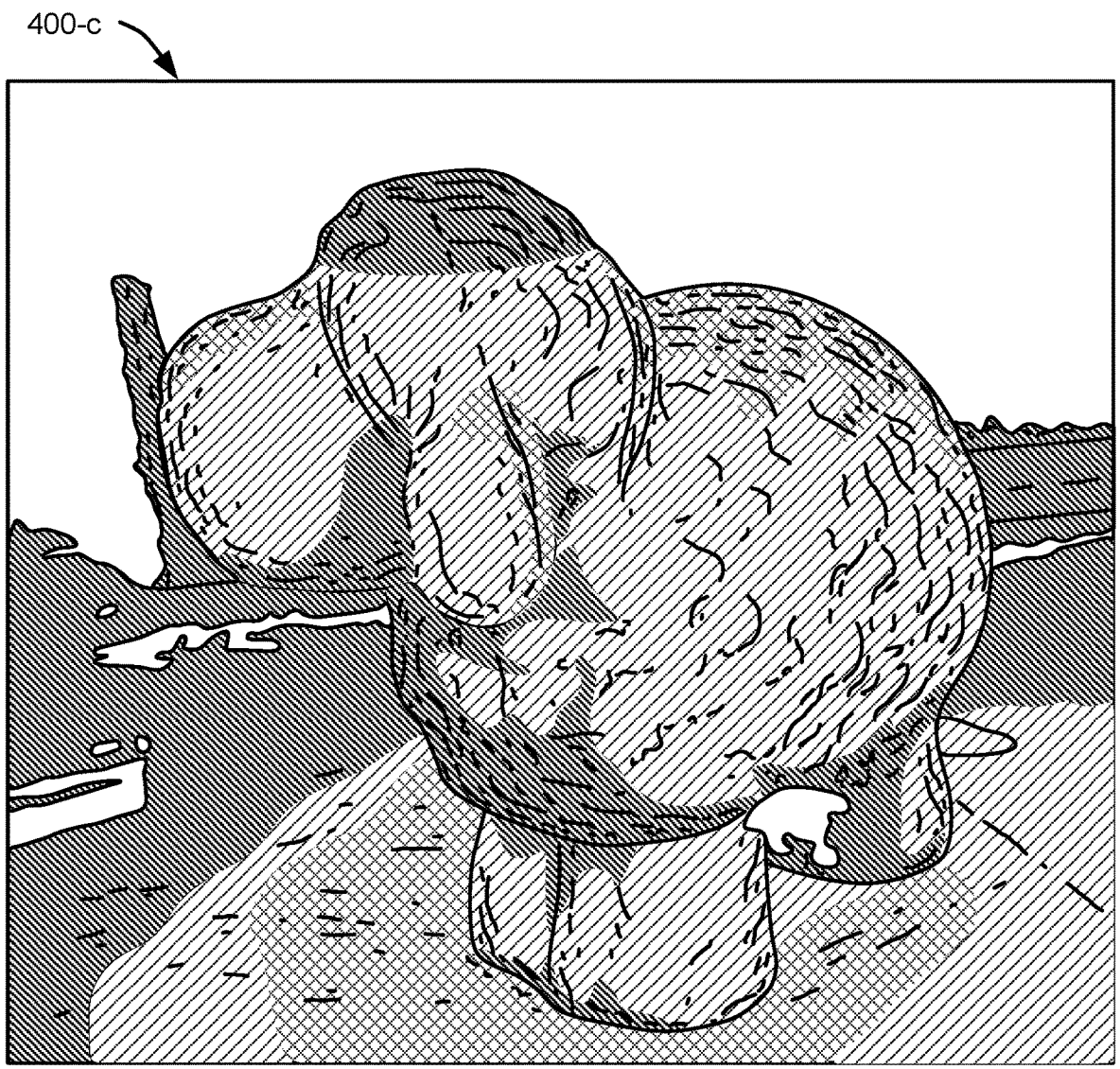
Figure 4C:
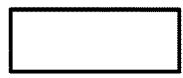
Figure 4C:
Figure 4C:
Figure 4C:
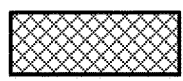

FIG. 4C illustrates the user interface displaying preview 400-*c* of the 3D reconstruction of the shape of the surface of the object. The preview 400-*c* is an update of preview 400-*b*. That is, preview 400-*c* illustrates the 3D reconstruction of the portion of the shape of the surface of the object at a third time that is later than the second time (e.g., includes all of the data acquired during the scan up until the third time).

Figure 4D:
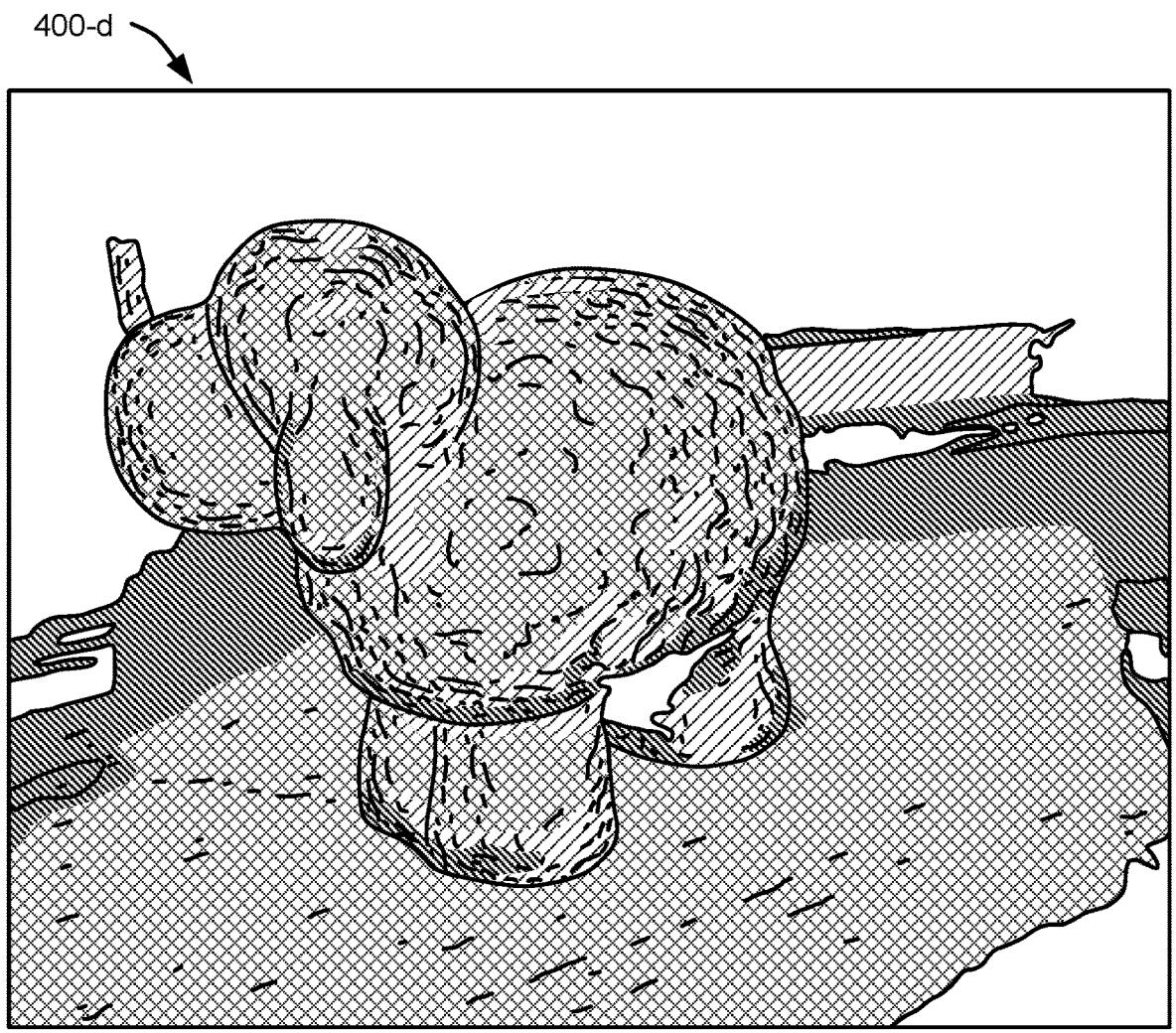
Figure 4D:
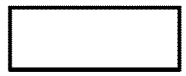
Figure 4D:
Figure 4D:
Figure 4D:

FIG. 4D illustrates the user interface displaying preview 400-*d* of the 3D reconstruction of the shape of the surface of the object. The preview 400-*d* is an update of preview 400-*c*. That is, preview 400-*d* illustrates the 3D reconstruction of the portion of the shape of the surface of the object at a fourth time that is later than the third time (e.g., includes all of the data acquired during the scan up until the third time). Preview 400-*d* indicates that nearly the entire object has sufficient data to reconstruct the 3D shape of the object.

Figure 4E:
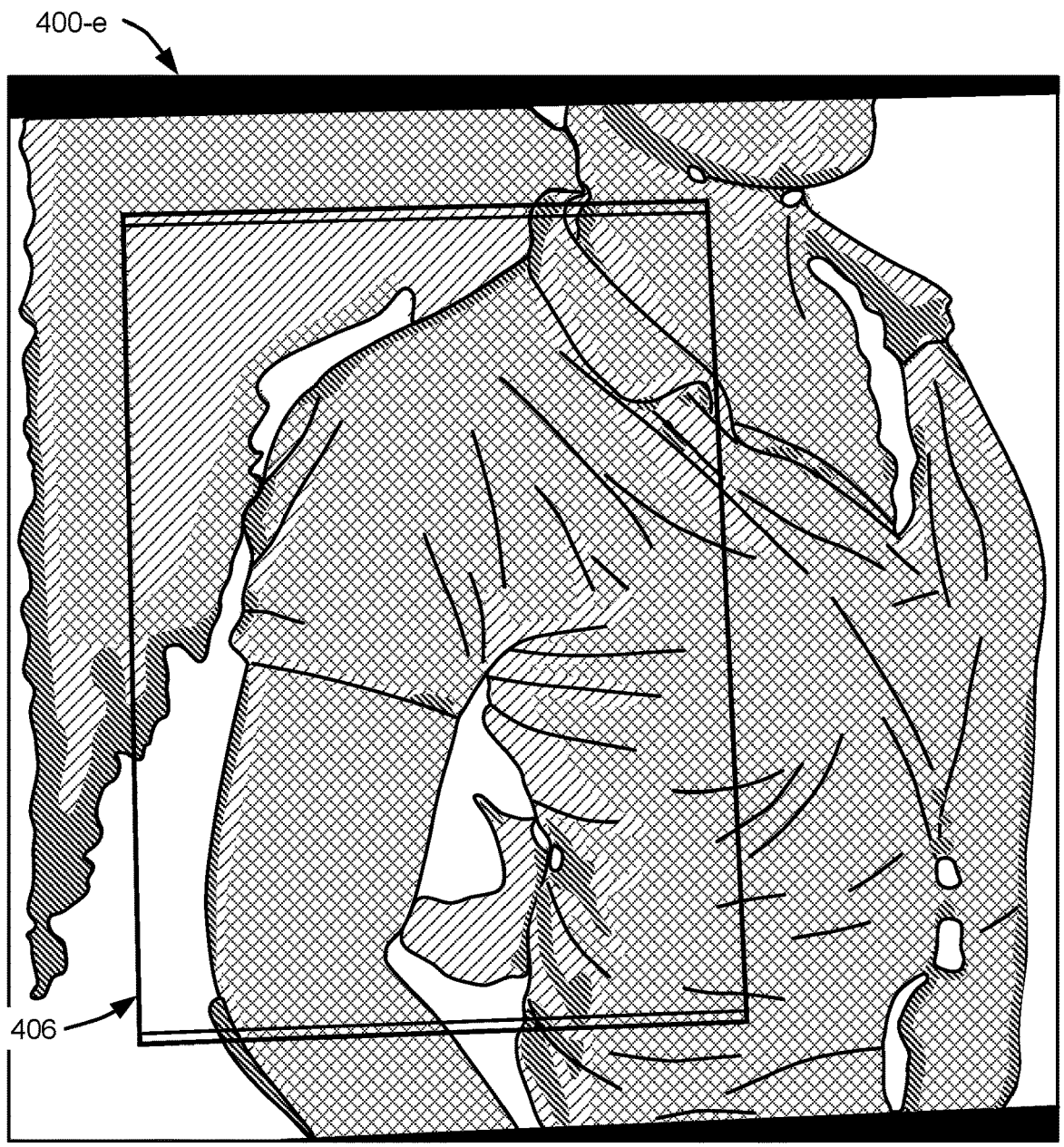
Figure 4F:
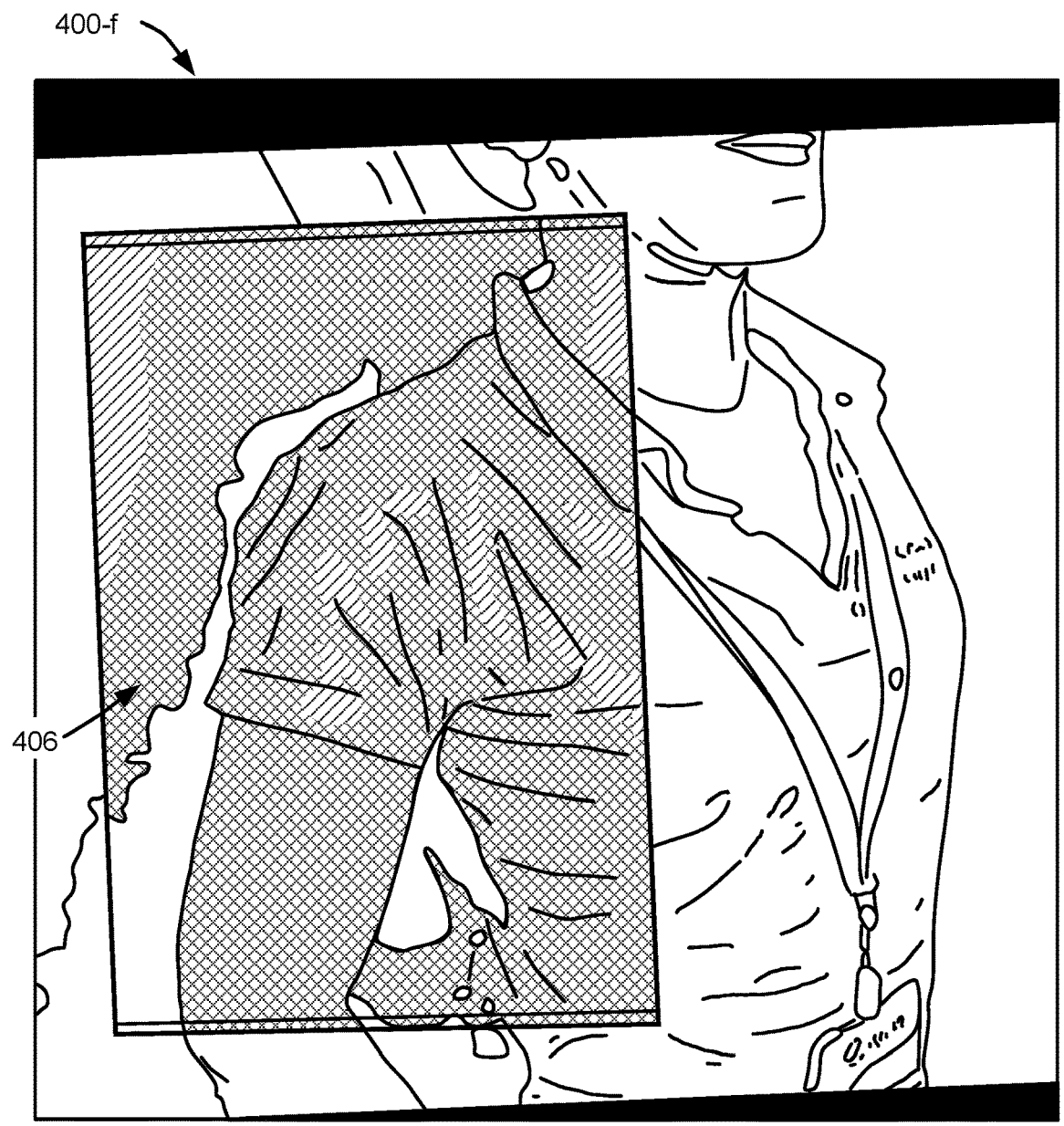

FIGS. 4E-4F illustrate a preview 404 of a different scene (as compared to FIGS. 4A-4D). In particular, preview 404 illustrate a preview of a 3D reconstruction of a human as the human is being scanned. The preview 404 shown in FIGS. 4E-4F is largely analogous to the preview 400 shown in FIGS. 4A-4D, described above, except for the differences noted below.

In particular, preview 404 displays an indication of an active region 406 of the scan (e.g., a region where data is currently being collected based on the position of the 3D scanner relative to the object). For example, preview 404 shows a rectangular box indicating the active region 406 of the scan. In some embodiments, the fill pattern or color within the active region 406 of the preview 404 indicates the distance to the object being scanned (e.g., rather than the quantity/quality of data), whereas the color outside of the active region of the preview 404 indicates the quantity and/or quality of data, as described above with reference to FIGS. 4A-4D. In some circumstances, providing the distance to the object for the active region 406 provides the user with more relevant information for the active region 406, since the user is already scanning the active region 406 and cannot therefore reposition the scanner to scan the active region 406. The user can, however, adjust the distance to the object to more efficiently collect data for the active region 406.

In addition, FIGS. 4E-4F illustrate that, in some embodiments, the user may toggle between showing a preview 404-*a* with the indication of the quality and/or quantity of the data and a preview 404-*b* that shows the natural texture (e.g., color) of the object. The latter may be useful to give the user a sense of what the final 3D reconstruction will look like.

One of skill in the art, having the benefit of this disclosure, will understand that there are numerous ways to provide feedback indicating a sufficient quantity and/or quality of data for a region of a reconstruction. For example, areas requiring more data may be outlined on the screen, or pointed to by an arrow. Alternative, aural and/or haptic cues may be used to provide such feedback. For example, an aural or haptic cue may be given to indicate that a current acquisition region has accumulated enough data, signifying that the user should move the scanner.

Figure 5:
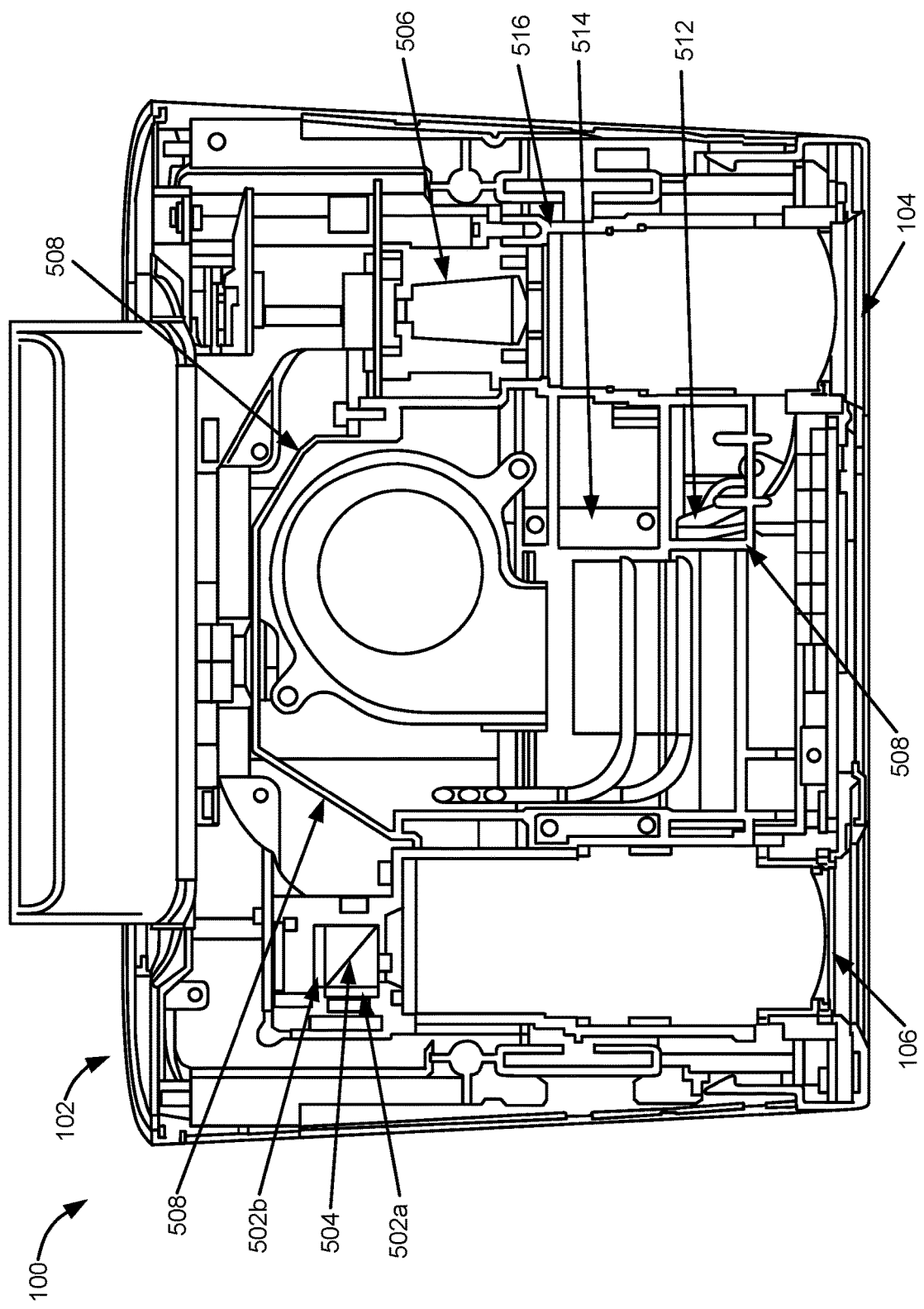
FIG. 5 is a mechanical drawing illustrating a cross section of a 3D scanner, including a cooling manifold, in accordance with some embodiments.

FIG. 5 is a mechanical drawing illustrating various components of 3D scanner 100, including a cooling manifold, in accordance with some embodiments. In particular, FIG. 5 illustrates a cross section of the main body housing 102 (FIG. 1). As shown in FIG. 5, the scanner 100 includes (among other components):

- A first optical sensor 502-*a* (e.g., a first charge-coupled device (CCD) detector) that collects 3D data of an object being scanned (e.g., collects images of structured light shone on and distorted by the surface of the object, from which a reconstruction of the 3D shape of the object can be determined). In some embodiments, the first optical sensor 502-*a* is sensitive to infrared (IR) light (although the first optical sensor 502-*a* may also be sensitive to visible light);
- A second optical sensor 502-*b* (e.g., a second CCD detector) that collects texture (e.g., color) data from an object being scanned (e.g., collects images while the structured light is not shown on the surface of the object, e.g., collects images in between stroboscopic pulses of structured light shone on the object). In some embodiments, the second optical sensor 502-*b* is sensitive to visible light (although the second optical sensor 502-*b* may also be visible to IR light);
- A beam splitter 504 that separates visible light and IR light. The beam splitter 504 preferentially directs the IR light received through camera optics 106 to the first optical sensor 502-*a* and preferentially directs the visible light received through camera optics 106 to the second optical sensor 502-*b*;
- A light source 506. In some embodiments, the light source 506 is a pulsed light source (e.g., a stroboscopic light source). In some embodiments, the light source 506 is an infrared light source. In some embodiments, the light source 506 is a laser. In some embodiments, the light source 506 is a vertical-cavity surface-emitting laser. In some embodiments, light source 506 is configured to operate (e.g., through suitable choice of pulse width, peak power, repetition rate, and/or duty cycle) as a class-1 laser everywhere outside of main body housing 102;
- A slide 516 that has formed (e.g., printed or etched thereon) the spatial pattern through which light is projected onto the surface of the object (e.g., the spatial pattern is formed as opaque and transparent portions of the slide). Thus, light produced by light source 506 is passed through the slide 516 and projected through the source optics 104 as structured light toward (e.g., onto) the surface of the object; and
- A cooling manifold 508 (labelled in several places in the drawing) comprising a single piece of metal thermally coupled with light source 506, optical sensors 502 and a plurality of processors, including a GPU (e.g., GPU 210, FIG. 2) positioned at position 514 and an FPGA (e.g., FPGA 206, FIG. 2) positioned at position 512.

Because of the way in which 3D data is obtained (e.g., stroboscopically producing light from a fairly powerful light source, as well as collecting and processing many images each second), heat production and removal is one of the biggest challenges in designing a handheld 3D scanner capable of previewing 3D reconstructions of objects in real-time. While maintaining a relatively cool temperature is important, maintaining a consistent temperature (both spatially and temporally) is at least equally important. The cooling manifold 508 maintains various components of the 3D scanner 100 at a consistent and stable temperature by providing thermal connectivity between the primary heat-generating components of the 3D scanner. Thus, cooling manifold 508 reduces the "warm-up" time needed for the 3D scanner to reach a stable temperature, allows for greater processing power, and increases the amount of time the 3D scanner can collect data.

Figure 6B:
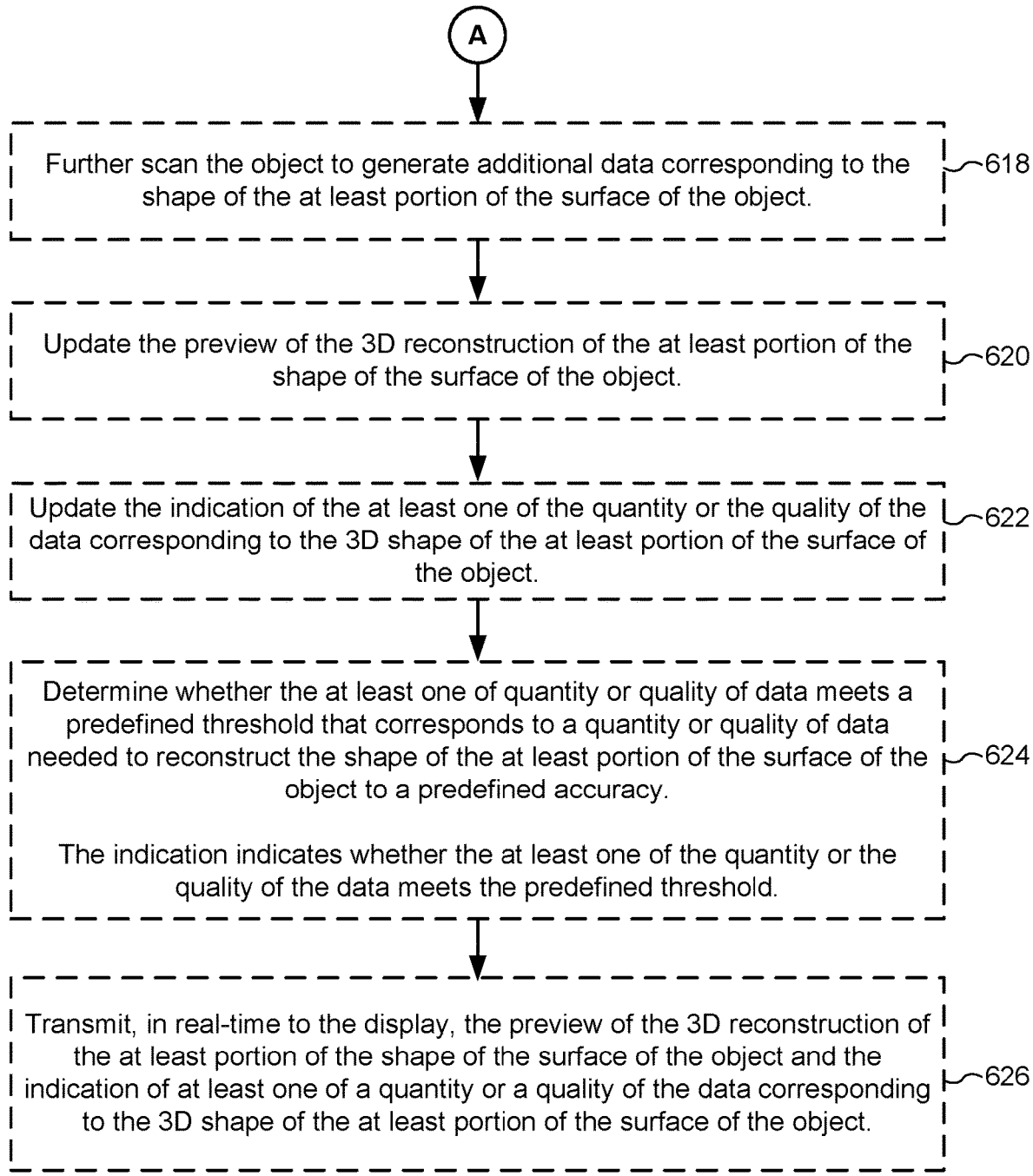

FIGS. 6A-6B illustrate a flow diagram of a method 600 of providing 3D data collection feedback from a 3D scanner, in accordance with some embodiments. Method 600 is performed at a 3D scanner (e.g., 3D scanner 100, FIGS. 1, 3, and 5) in communication with a display. The 3D scanner includes one or more optical sensors. In some embodiments, the 3D scanner includes the display. In some embodiments, the 3D scanner includes processors for generating a 3D reconstruction of at least a portion of the shape of a surface of an object. In some embodiments, the 3D scanner is a portable handheld 3D scanner (e.g., has a size less than 30 cm×30 cm×30 cm, such that the entire device would fit inside a box that is 30 cm×30 cm×30 cm). Some operations in method 600 are, optionally, combined and/or the order of some operations is, optionally, changed. For ease of explanation, method 600 is described as being performed by 3D scanner 100. However, method 600 can be carried out using any 3D scanner built in accordance with the instant disclosures. Conversely, in other embodiments, 3D scanner 100 performs methods other than method 600 in accordance with the teachings of the instant disclosure.

As described below, method 600 provides 3D data collection feedback from 3D scanner 100. In some embodiments, while the user scans the object to collect data, 3D scanner 100 displays a preview of the 3D reconstruction of the object as well as an indication of the quality or quantity of the data. In some embodiments, the indication of the quality or the quantity of the data is overlaid on the 3D reconstruction of the object. For example, the 3D reconstruction of the object appears as a surface, and the color of the surface represents the quantity or quality of the data. The user can thus see, on the display, where there are gaps in the data. For example, when there is no data at all for a portion of the object, in some embodiments, the preview of the 3D reconstruction shows no surface at all for that area of the object. When there is some data for a portion of the object, but not enough to form an adequate reconstruction of that portion of the object, the 3D reconstruction of that portion of the object is rendered in red.

Thus, a user can determine both when he or she has collected enough data and also can determine which portions of the object require more data collection. The latter feature allows the user to focus scanning on those portions of the object that require more data. Compared to method 600, previous methods of 3D scanning required the user to collect data without having sufficient feedback to know when enough data has been collected. As a result, to be safe, users would acquire an excessive amount of data, which resulted in excessive use of memory and heat production. The problem of excessive memory use and heat production made it difficult to produce a truly self-contained handheld 3D scanner, since the memory and heat-producing tasks would be delegated, usually by means of a wired connection, to an external computer. Thus, method 600 improves the 3D scanner itself by facilitating efficient collection of data, which in turn facilitates a smaller size of 3D scanner 100. For battery-operated electronic devices, enabling a user to acquire 3D scanning data faster and more efficiently conserves power and increases the time between battery charges.

Scanner 100 scans (602), using one or more optical sensors, an object having a surface. The scanning generates data corresponding to a three-dimensional (3D) shape of at least a portion of the surface of the object. In some embodiments, the one or more sensors include (604) a camera (e.g., optical sensors 502, FIG. 5). Scanning the object includes repeatedly performing the operations of: projecting a spatial pattern of light onto the surface of the object (e.g., using light source 506 and slide 516, FIG. 5); and while the spatial pattern of light is projected onto the surface of the object, acquiring, using the camera, an image of the surface of the object. In some embodiments, scanning the object also includes collecting color data (e.g., as described with reference to color data 204-a, FIG. 2) and collecting motion data (e.g., as described with reference to movement data 204-c, FIG. 2).

Scanner 100 generates (606), using the data, a 3D reconstruction of the at least portion of the shape of the surface of the object (e.g., as described with reference to the operations performed by FPGA 206 and GPU 210, FIG. 2). In some embodiments, the generated 3D reconstruction of the at least portion of the shape of the surface of the object is an initial reconstruction rather than a final reconstruction. For example, after the scan is complete, additional post-scan processing operations (e.g., further alignment) may be performed to improve the 3D reconstruction.

Scanner 100 provides (608), to the display, a preview of the 3D reconstruction of the at least portion of the shape of the surface of the object (e.g., preview 400, FIGS. 4A-4D, preview 404, FIGS. 4E-4F). In some embodiments, displaying the preview of the 3D reconstruction of the at least portion of the shape of the surface of the object includes displaying a fused voxel representation described with reference to FIG. 2.

Scanner 100 provides (610), to the display, for rendering with the preview of the 3D reconstruction of the at least portion of the shape of the surface of the object, an indication of at least one of a quantity or a quality of the data corresponding to the 3D shape of the at least portion of the surface of the object.

In some embodiments, scanner 100 provides, to the display, for rendering with the preview of the 3D reconstruction of the at least portion of the shape of the surface of the object, an indication of the quality of the data corresponding to the 3D shape of the at least portion of the surface of the object. In some embodiments, the indication of the quality of the data is an indication of an accuracy or resolution of the data. In some embodiments, the indication of the accuracy of the data indicates the statistically-likely difference (e.g., maximum or median difference) between the actual shape of the surface of the object and the 3D reconstruction of the shape of the surface of the object (e.g., the indication of the accuracy of the data represents an approximation of a reconstruction error reciprocal).

In some embodiments, scanner 100 provides, to the display, for rendering with the preview of the 3D reconstruction of the at least portion of the shape of the surface of the object, an indication of the quantity of the data corresponding to the 3D shape of the at least portion of the surface of the object. In some embodiments, the indication of the quantity of the data is measured by a number of samples (e.g., points) each voxel accumulates in the process of scanning.

In some embodiments, scanner 100 provides, to the display, for rendering with the preview of the 3D reconstruction of the at least portion of the shape of the surface of the object, an indication of a combined metric of quantity and quantity of the data (e.g., a metric that is based on both the quantity and the quality of the data) corresponding to the 3D shape of the at least portion of the surface of the object. For example, in some embodiments, scanner 100 provides, to the display, for rendering with the preview of the 3D reconstruction of the at least portion of the shape of the surface of the object, an indication of a product of the quantity and quality of the data (e.g., a product of the reconstruction error reciprocal for each respective voxel and the number of samples accumulated for the respective voxel).

In some embodiments, scanner 100 provides (612), to the display, a plurality of distinct indicia of at least one of quantity or quality of data corresponding to distinct portions of the surface of the object (e.g., an indication for each voxel). In some embodiments, the indication of the at least one of the quantity or the quality of the data is (614) displayed as part of the preview of the 3D reconstruction of the at least portion of the shape of the surface of the object. In some embodiments, the indication of the at least one of the quantity or the quality of the data is (616) displayed as the color of the preview of the portion of the surface (e.g., as described with reference to preview 400, FIGS. 4A-4D, preview 404, FIGS. 4E-4F). For example, each voxel that represents the surface of the object, in the preview of the 3D reconstruction, is displayed in a color that represents the quantity and/or quality of the data corresponding to that respective voxel.

In some embodiments, the scanner 100 is configured to provide, to the display, for rendering with the preview of the 3D reconstruction of the at least portion of the shape of the surface of the object, a plurality of distinct and alternate indicia of the quantity and/or quality of the data corresponding to the 3D shape of the at least portion of the surface of the object (e.g., alternate indicia indicating different properties of the 3D reconstruction). In some embodiments, the user may toggle between the distinct and alternate indicia of the quantity and/or quality of the data (e.g., one indication is displayed at a time). For example, in some embodiments, 3D scanner 100 receives a user input to change from displaying an indication of the quantity of the data to displaying an indication of the quality of the data. As noted above (e.g., with reference to FIGS. 4E-4F), in some embodiments, the user may also toggle between displaying the indication of the quantity and/or quality of the data and displaying the 3D reconstruction with its natural texture.

In some embodiments, the indication of the at least one of the quantity or the quality of the data is provided for output (e.g., displayed, by an audio and/or a visual signal or otherwise). For example, in some embodiments, the indication is an audible indication (e.g., a "ding" when sufficient data is obtained). In some embodiments, the indication comprises an arrow that points to regions of the object for which additional data is needed. In other embodiments, the sufficiency of the quantity or the quality of the data is indicated by one or more beeps or by one or more flashes of light.

In some embodiments, scanner 100 further scans (618) the object to generate additional data corresponding to the shape of the at least portion of the surface of the object. Scanner 100 updates (620) the preview of the 3D reconstruction of the at least portion of the shape of the surface of the object. Scanner 100 updates (622) the indication of the at least one of the quantity or the quality of the data corresponding to the 3D shape of the at least portion of the surface of the object. For example, preview 400-b (FIG. 4B) is an update of preview 400-a (FIG. 4A).

In some embodiments, scanner 100 determines (624) whether the at least one of quantity or quality of data meets a predefined threshold. In some embodiments, the predefined threshold corresponds to a quantity or quality of data needed to reconstruct the shape of the at least portion of the surface of the object to a predefined accuracy (or resolution). The indication indicates whether the at least one of the quantity or the quality of the data meets the predefined threshold.

For example, with reference to FIG. 4D, scanner 100 determines whether the quantity and/or quality of data meet predefined accuracy and/or resolution criteria for respective portions of the surface of the object (e.g., on a voxel-by-voxel basis). Voxels that represent the surface of the object and meet the predefined criteria are rendered in a fill pattern corresponding to the data that meet the predefined criteria.

In some embodiments, the user can configure the predefined criteria. For example, the user can configure the 3D scanner to set the needed accuracy and/or resolution. For example, the user can configure the scanner 100 to obtain a 3D reconstruction with an accuracy of at least 0.1 mm, 0.2 mm, 0.3 mm, 0.4 mm, or 0.5 mm; or, alternatively, with a resolution of 0.25 mm, 0.5 mm, 0.75 mm, or 1 mm. The indication of the quantity or quality of the data is adjusted based on the accuracy and/or resolution provided by the user. For example, when the user sets the scanner 100 to obtain a 3D reconstruction with an accuracy of 0.5 mm, a representative voxel in the preview is rendered in green when there is sufficient data such that the respective voxel represents the surface of the object with an accuracy of 0.5 mm. However, if the user sets the scanner 100 to obtain a 3D reconstruction with an accuracy of 0.1 mm, a representative voxel in the preview is rendered in green when there is sufficient data such that the respective voxel represents the surface of the object with an accuracy of 0.1 mm. Providing quantity and/or quality feedback to the user that is based on the accuracy and/or resolution needs of the user helps the scanner 100 obtain a satisfactory scan while reducing the amount of memory (e.g., storage) needed to do so.

In some embodiments, scanner 100 transmits (626), in real-time to the display, the preview of the 3D reconstruction of the at least portion of the shape of the surface of the object and the indication of at least one of a quantity or a quality of the data corresponding to the 3D shape of the at least portion of the surface of the object. For example, in some embodiments, the display is separate from the scanner 100 and the scanner 100 wireless transmits (e.g., over Bluetooth, Wi-Fi, or the Internet), in real-time to the display, the preview of the 3D reconstruction of the at least portion of the shape of the surface of the object and the indication of at least one of a quantity or a quality of the data corresponding to the 3D shape of the at least portion of the surface of the object.

It should be understood that the particular order in which the operations in FIGS. 6A-6B have been described is merely an example and is not intended to indicate that the described order is the only order in which the operations could be performed. One of ordinary skill in the art would recognize various ways to reorder the operations described herein. Additionally, it should be noted that details of other processes described herein with respect to other methods described herein (e.g., methods 200 and 700) are also applicable in an analogous manner to method 600 described above with respect to FIGS. 6A-6B.

Figure 7:
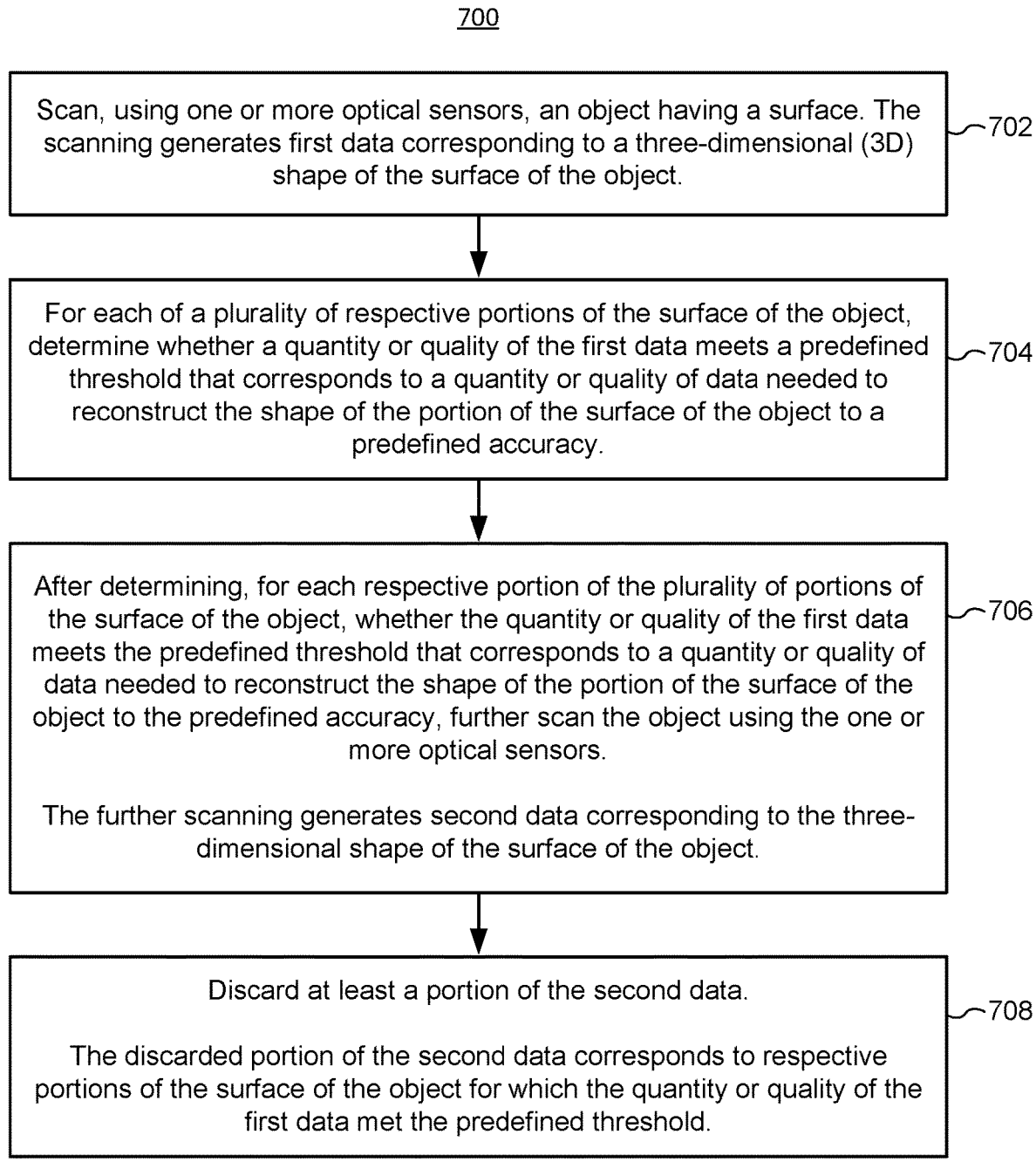
FIG. 7 illustrates a flow diagram of a method of acquiring and storing data from a 3D scanner, in accordance with some embodiments.

FIG. 7 illustrates a flow diagram of a method 700 of acquiring and storing data from a 3D scanner, in accordance with some embodiments. Method 700 is performed at a 3D scanner (e.g., 3D scanner 100, FIGS. 1, 3, and 5). The 3D scanner includes one or more optical sensors. In some embodiments, the 3D scanner includes processors for generating a 3D reconstruction of at least a portion of a shape of a surface of an object. In some embodiments, the 3D scanner is a portable handheld 3D scanner (e.g., has a size less than 30 cm×30 cm×30 cm, such that the entire device would fit inside a box that is 30 cm×30 cm×30 cm). Some operations in method 700 are, optionally, combined and/or the order of some operations is, optionally, changed. For ease of explanation, method 700 is described as being performed by 3D scanner 100.

A further challenge in designing 3D scanners is that 3D scanners produce an immense amount of data during scans. Method 700 improves the process of storing data from a 3D scanner by identifying regions of an object being scanned for which sufficient data has already been collected. Method 700 then discards some or all of the data collected for those regions as the scan continues. Thus, method 700 reduces the entire amount of data collected while scanning an object, which improves the device by reducing the amount of storage needed for the device, or alternatively, allowing the storage that is present on the device to be used where it is needed most, resulting in higher quality 3D reconstructions.

To that end, scanner 100 scans (702), using one or more optical sensors, an object having a surface. The scanning generates first data corresponding to a three-dimensional (3D) shape of the surface of the object.

In some embodiments, the one or more sensors include a camera. In some embodiments, scanning the object includes performing a first set of iterations (e.g., a plurality of iterations) of projecting a spatial pattern of light onto the surface of the object; and, while the spatial pattern of light is projected onto the surface of the object, acquiring, using the camera, a respective image of the surface of the object. In some embodiments, scanning the object includes generating a 3D reconstruction of at least a portion of the shape of the surface of the object from the respective images acquired in the first set of iterations.

For each of a plurality of respective portions of the surface of the object, scanner 100 (704) determines whether a quantity or quality of the first data meets a predefined threshold that corresponds to a quantity or quality of data needed to reconstruct the shape of the portion of the surface of the object to a predefined accuracy (or resolution).

In some embodiments, the user can configure the predefined accuracy (or resolution). For example, the user can configure the 3D scanner to set the needed accuracy and/or resolution. For example, the user can configure the scanner 100 to obtain a 3D reconstruction with an accuracy of at least 0.1 mm, 0.2 mm, 0.3 mm, 0.4 mm, or 0.5 mm; or, alternatively, with a resolution of 0.25 mm, 0.5 mm, 0.75 mm, or 1 mm. The indication of the quantity or quality of the data is adjusted based on the accuracy and/or resolution provided by the user. For example, when the user sets the scanner 100 to obtain a 3D reconstruction with an accuracy of 0.5 mm, a representative voxel in the preview is rendered in green when there is sufficient data such that the respective voxel represents the surface of the object with an accuracy of 0.5 mm. However, if the user sets the scanner 100 to obtain a 3D reconstruction with an accuracy of 0.1 mm, a representative voxel in the preview is rendered in green when there is sufficient data such that the respective voxel represents the surface of the object with an accuracy of 0.1 mm. Providing quantity and/or quality feedback to the user that is based on the accuracy and/or resolution needs of the user helps the scanner 100 obtain a satisfactory scan while reducing the amount of memory (e.g., storage) needed to do so.

After determining, for each respective portion of the plurality of portions of the surface of the object, whether the quantity or quality of the first data meets the predefined threshold that corresponds to a quantity or quality of data needed to reconstruct the shape of the portion of the surface of the object to the predefined accuracy, scanner 100 further scans (706) the object using the one or more optical sensors. The further scanning generates second data corresponding to the three-dimensional shape of the surface of the object.

In some embodiments, further scanning the object includes performing a second set of iterations (e.g., one or more iterations) of projecting the spatial pattern of light onto the surface of the object; and, while the spatial pattern of light is projected onto the surface of the object, acquiring, using the camera, a respective image of the surface of the object. In some embodiments, further scanning the object includes generating a 3D reconstruction of at least a portion of the shape of the surface of the object from the one or more respective images acquired in the second set of one or more iterations. In some embodiments, scanner 100 registers the 3D reconstruction from the second set of one or more iterations with the 3D reconstruction from the first set of one or more iterations (e.g., as described above with respect to 3D registration operation 212-*b*, FIG. 2) prior to identifying portions of the second data that corresponds to respective portions of the surface of the object for which the quantity or quality of the first data met the predefined threshold. In some embodiments, the scanner 100 identifies, using the registered 3D reconstruction from the second set of one or more iterations, portions of the second data that corresponds to respective portions of the surface of the object for which the quantity or quality of the first data met the predefined threshold.

Scanner 100 discards (708) at least a portion of the second data. The discarded portion of the second data corresponds to respective portions of the surface of the object for which the quantity or quality of the first data met the predefined threshold (e.g., the identified portions described above). In some embodiments, scanner 100 stores (e.g., in memory) a complementary portion of the second data that corresponds to respective portions of the surface of the object for which the quantity or quality of the first data did not meet the predefined threshold.

It should be understood that the particular order in which the operations in FIG. 7 have been described is merely an example and is not intended to indicate that the described order is the only order in which the operations could be performed. One of ordinary skill in the art would recognize various ways to reorder the operations described herein. Additionally, it should be noted that details of other processes described herein with respect to other methods described herein (e.g., methods 200 and 600) are also applicable in an analogous manner to method 700 described above with respect to FIG. 7.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best use the invention and various described embodiments with various modifications as are suited to the particular use contemplated.

It will also be understood that, although the terms first, second, etc. are, in some instances, used herein to describe various elements, these elements should not be limited by these terms. These terms are only used to distinguish one element from another. For example, a first sensor could be termed a second sensor, and, similarly, a second sensor could be termed a first sensor, without departing from the scope of the various described embodiments. The first sensor and the second sensor are both sensors, but they are not the same sensor, unless the context clearly indicates otherwise.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

What is claimed is:

1. A three-dimensional (3D) scanner, comprising:
a housing;
one or more light sources internal to the housing;
one or more optical sensors internal to the housing;
a plurality of processors, internal to the housing, in communication with the one or more light sources and the one or more optical sensors;
memory, internal to the housing, storing instructions which, when executed by the plurality of processors cause the 3D scanner to generate data corresponding to a 3D shape of at least a portion of a surface of an object by repeatedly performing the operations of:
projecting, using the one or more light sources, structured light toward the surface of the object; and
while projecting the structured light toward the surface of the object, acquiring, using the one or more optical sensors, an image of the surface of the object; and
a cooling manifold internal to the housing comprising a single piece of metal thermally coupled with and configured to provide thermal connectivity between the one or more light sources, the one or more optical sensors and the plurality of processors, so as to maintain a spatially-consistent temperature between the one or more light sources, the one or more optical sensors and the plurality of processors.

2. The 3D scanner of claim 1, wherein the plurality of processors includes a first processing module that includes a field programmable gate array (FPGA) and a second processing module that includes a graphical processing unit (GPU).

3. The 3D scanner of claim 1, wherein the memory further stores instructions which, when executed by the plurality of processors cause the 3D scanner to generate, using the data, a 3D reconstruction of the shape of the at least portion of the surface of the object.

4. The 3D scanner of claim 1, wherein the one or more light sources comprise lasers.

5. The 3D scanner of claim 4, wherein the lasers are configured to operate as class-1 light sources when projecting light outside of the housing of the 3D scanner.

6. The 3D scanner of claim 4, wherein the lasers are vertical-cavity surface-emitting lasers (VCSELs).

7. The 3D scanner of claim 1, wherein the light sources are pulsed-light sources.

8. The 3D scanner of claim 1, wherein the 3D scanner is a portable handheld 3D scanner.

9. The 3D scanner of claim 8, wherein the portable handheld 3D scanner has a size less than 30 cm×30 cm×30 cm.

10. The 3D scanner of claim 1, wherein the one or more light sources are configured to provide sufficient illumination of the surface of the object so that images acquired in outdoor daylight conditions have a signal-to-noise ratio greater than two.

11. A method, comprising:
at a 3D scanner that includes one or more optical sensors:
scanning, using the one or more optical sensors, an object having a surface, wherein the scanning generates first data corresponding to a three-dimensional (3D) shape of the surface of the object;
for each of a plurality of respective portions of the surface of the object, determining whether a quantity of the first data meets a predefined threshold that corresponds to a quantity of data needed to reconstruct the 3D shape of the portion of the surface of the object to a predefined accuracy;
after determining, for each respective portion of the plurality of portions of the surface of the object, whether the quantity of the first data meets the predefined threshold that corresponds to a quantity of data needed to reconstruct the shape of the portion of the surface of the object to the predefined accuracy, further scanning the object using the one or more optical sensors, wherein the further scanning generates second data corresponding to the 3D shape of the surface of the object; and
discarding at least a portion of the second data, wherein the discarded portion of the second data corresponds to respective portions of the surface of the object for which the quantity of the first data met the predefined threshold.

12. The method of claim 11, wherein:
the 3D scanner is in communication with a display; and
the method further includes:
generating, using the first data, a 3D reconstruction of the shape of the surface of the object;
providing, to the display, a preview of the 3D reconstruction of the shape of the surface of the object; and
providing, to the display, for rendering with the preview of the 3D reconstruction of the shape of the surface of the object, an indication of the quantity of the first data corresponding to the 3D shape of the surface of the object, wherein the indication indicates whether the quantity of the first data meets the predefined threshold.

13. The method of claim 12, wherein the indication of the quantity of the first data is displayed as part of the preview of the 3D reconstruction of the shape of the surface of the object.

14. The method of claim 12, further comprising:
using the second data:
updating the preview of the 3D reconstruction of the shape of the surface of the object; and
updating the indication of the quantity of the first and second data corresponding to the 3D shape of the surface of the object.

15. The method of claim 12, further including:
providing, to the display, a plurality of distinct indicia of quantity of data corresponding to distinct portions of the surface of the object.

16. The method of claim 11, wherein the 3D scanner includes processors for generating the 3D reconstruction of the shape of the surface of the object.

17. The method of claim 11, wherein:
the one or more optical sensors include a camera;
scanning the object includes repeatedly performing the operations of:
projecting a spatial pattern of light onto the surface of the object; and
while the spatial pattern of light is projected onto the surface of the object, acquiring, using the camera, an image of the surface of the object.

18. The method of claim 11, wherein the 3D scanner includes a display.

19. The method of claim 11, wherein the 3D scanner is a portable handheld 3D scanner.

20. The 3D scanner of claim 1, wherein the cooling manifold is shaped to include a position for each of the plurality of processors.

* * * * *